(12) United States Patent
Tanaka et al.

(10) Patent No.: US 12,292,460 B2
(45) Date of Patent: *May 6, 2025

(54) CURRENT SENSOR

(71) Applicant: Asahi Kasei Microdevices Corporation, Tokyo (JP)

(72) Inventors: Ken Tanaka, Tokyo (JP); Masaki Tsujimoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/420,664

(22) Filed: Jan. 23, 2024

(65) Prior Publication Data

US 2024/0168063 A1 May 23, 2024

Related U.S. Application Data

(63) Continuation of application No. 18/456,508, filed on Aug. 27, 2023, now Pat. No. 12,044,707.

(30) Foreign Application Priority Data

Oct. 4, 2022 (JP) .................................. 2022-160194

(51) Int. Cl.
*G01R 15/20* (2006.01)
*G01R 19/00* (2006.01)

(52) U.S. Cl.
CPC ......... *G01R 15/20* (2013.01); *G01R 19/0092* (2013.01)

(58) Field of Classification Search
CPC .... G01R 15/20; G01R 15/27; G01R 19/0092; H01L 23/49575; H01L 23/66
See application file for complete search history.

(56) References Cited

U.S. PATENT DOCUMENTS

| 11,644,485 | B2 | 5/2023 | Liu | |
| 11,768,230 | B1 * | 9/2023 | Liu | ........................ H10N 52/01 |
| | | | | 324/126 |

(Continued)

FOREIGN PATENT DOCUMENTS

| JP | 2013245942 A | 12/2013 |
| JP | 2015045634 A | 3/2015 |

(Continued)

OTHER PUBLICATIONS

U.S. Appl. No. 18/456,508, filed Aug. 27, 2023.

*Primary Examiner* — Dominic E Hawkins

(57) ABSTRACT

A current sensor is configured such that at least one magnetoelectric conversion element, a conductor, and a signal processing IC are encapsulated with an encapsulating portion. The current sensor is comprised of a pair of first lead terminals that is partially exposed on a side surface of the encapsulating portion, is electrically connected to the conductor, inputs a measurement current to the conductor, and outputs the measurement current from the conductor; a metal member that is partially exposed on a side surface of the encapsulating portion and is spaced apart from the conductor; and an element supporting portion that is comprised of a metal plate or a semiconductor substrate, supports the at least one magnetoelectric conversion element and a metal member on a surface on a same side as the first surface, and is spaced apart from the conductor.

4 Claims, 19 Drawing Sheets

(56) References Cited

U.S. PATENT DOCUMENTS

| | | |
|---|---|---|
| 2005/0045359 A1 | 3/2005 | Doogue |
| 2008/0297138 A1 | 12/2008 | Taylor |
| 2011/0248711 A1 | 10/2011 | Ausserlechner |
| 2013/0187644 A1 | 7/2013 | Tay |
| 2014/0167736 A1 | 6/2014 | Suzuki |
| 2016/0187388 A1* | 6/2016 | Suzuki ............... G01R 15/207 324/244 |
| 2017/0160313 A1 | 6/2017 | Koiwa |
| 2017/0222131 A1 | 8/2017 | Chew |
| 2019/0391185 A1* | 12/2019 | El Bacha ............... G01R 33/07 |

FOREIGN PATENT DOCUMENTS

| | | |
|---|---|---|
| JP | 2016065882 A | 4/2016 |
| JP | 6017182 B2 | 10/2016 |
| JP | 2018165699 A | 10/2018 |

* cited by examiner

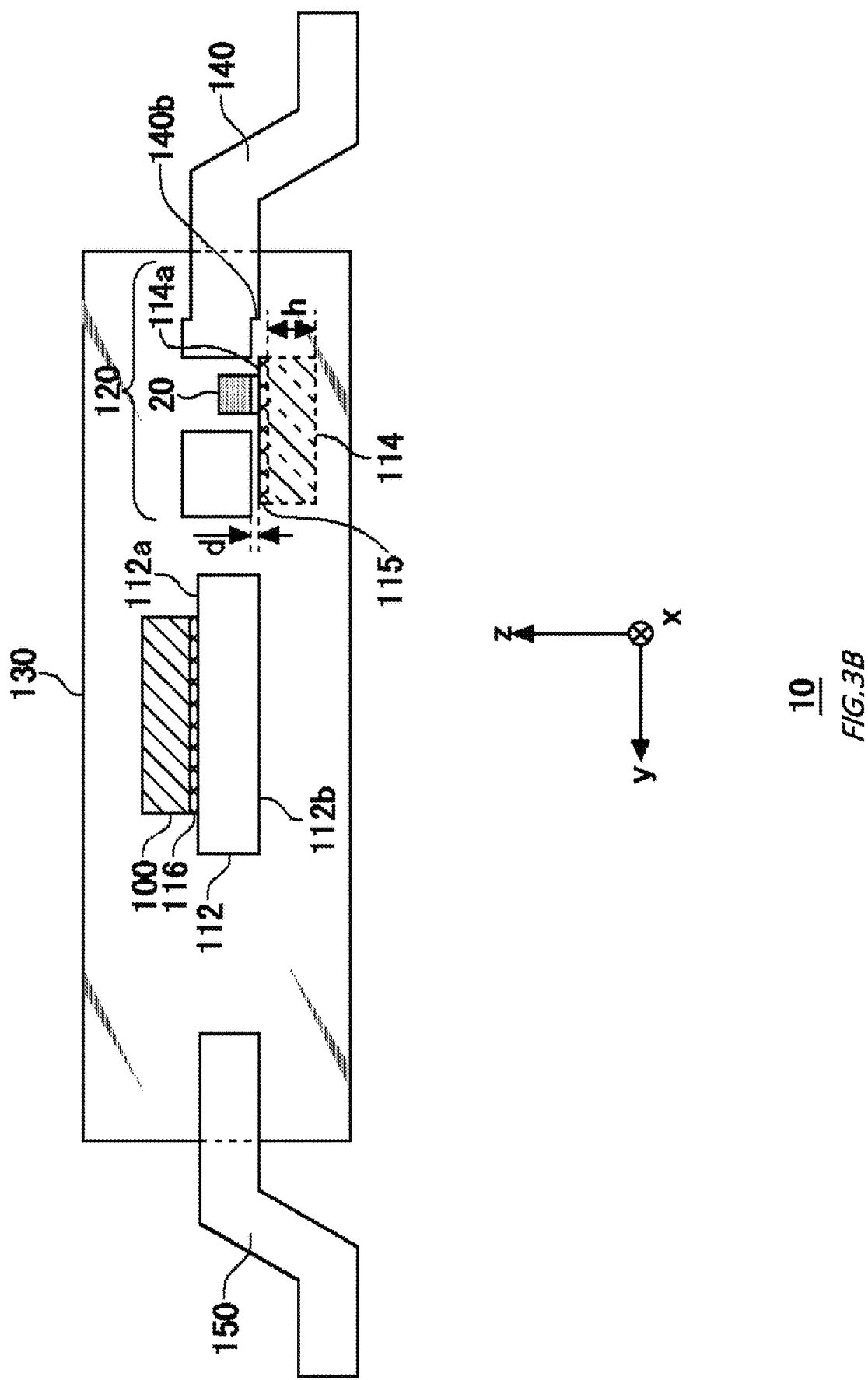

CURRENT SENSOR

CROSS-REFERENCE TO RELATED APPLICATIONS

This application is a continuation of U.S. patent application Ser. No. 18/456,508, filed on Aug. 27, 2023, the entire contents of which are explicitly incorporated herein by reference. The application also claims priority from the following Japanese patent application, which is explicitly incorporated herein by reference:

No. 2022-160194 filed in JP on Oct. 4, 2022.

BACKGROUND

1. Technical Field

The present invention relates to a current sensor.

2. Related Art

Patent Document 1 and Patent Document 2 disclose a current sensor having a magnetoelectric conversion element.

PRIOR ART DOCUMENT

Patent Document

Patent Document 1: Japanese Patent No. 6415148
Patent Document 2: Japanese Patent No. 6017182

BRIEF DESCRIPTION OF THE DRAWINGS

FIG. 3B is an A-A line sectional view of the current sensor shown in FIG. 3A.

DESCRIPTION OF EXEMPLARY EMBODIMENTS

Figure 1A:
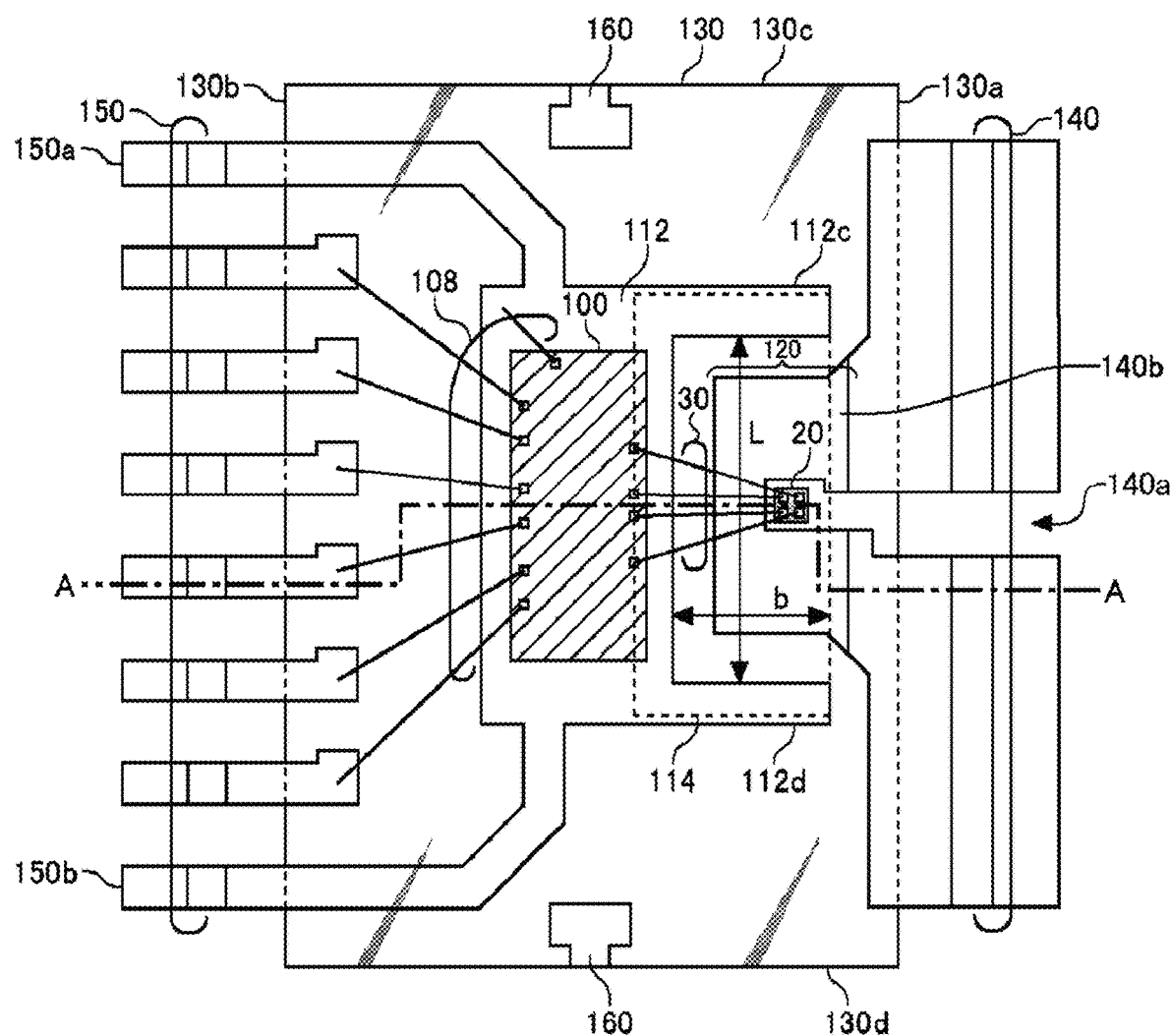
FIG. 1A is a schematic plan view seen from the top side of a current sensor according to a first embodiment.
Figure 1A:
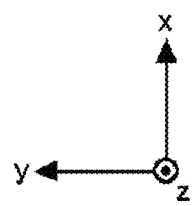

Hereinafter, embodiments of the present invention will be described, but the embodiments do not limit the invention according to the claims. In addition, not all of the combinations of features described in the embodiments are essential to the solution of the invention.

The current sensor includes a primary conductor through which a measurement current to be measured flows; a magnetoelectric conversion element that detects a magnetic field generated by the measurement current; and a signal processing IC that amplifies a signal of the magnetoelectric conversion element and outputs it to the outside. The current sensor is provided as one semiconductor package such that the primary conductor, the magnetoelectric conversion element, and the signal processing IC are encapsulated by a mold resin.

For example, Patent Document 1 discloses a current sensor including a primary conductor with a U-shape, a magnetoelectric conversion element arranged at an opening of the primary conductor, and a signal processing IC. An insulating member supporting the magnetoelectric conversion element is arranged such that it is in contact with a bottom surface of a supporting portion that supports the signal processing IC without being contact with the primary conductor.

In addition, Patent Document 2 also discloses a current sensor including a primary conductor with a U-shape, a magnetoelectric conversion element arranged at an opening of the primary conductor, and a signal processing IC. An insulating member supporting the magnetoelectric conversion element is arranged such that it is in contact with a back surface of the primary conductor.

In the current sensor according to Patent Document 1 and Patent Document 2, the insulating member supporting the magnetoelectric conversion element is comprised of an insulating tape or an insulating sheet. However, because the insulating member has a low stiffness, the insulating member may deform during being encapsulated by a resin in an assembly process. Deformation of the insulating member changes a position of the magnetoelectric conversion element provided at the opening of the primary conductor, causing a variation among individuals in a sensitivity of the measurement current to be measured by the magnetoelectric conversion element, which may deteriorate a quality of the current sensor.

In addition, an apparatus that produces an insulating member used for the current sensor described in Patent Document 1 and Patent Document 2 is not a general apparatus used for a general back-end process, but a dedicated apparatus. The dedicated apparatus is used to cut the insulating member into pieces with a desired size and attach it to a lead frame. Thus, manufacturing these current sensors needs an investment in the dedicated apparatus and makes the manufacturing process complicated, which results in a concern for the increase of a cost.

In view of this, each embodiment provides a small and highly sensitive current sensor with a high quality that can be brought by a reduction of a variation among individuals in a measurement sensitivity of a measurement current. In addition, each embodiment provides a small and highly sensitive current sensor that can achieve a cost reduction through a volume efficiency due to an efficient production.

Figure 1B:
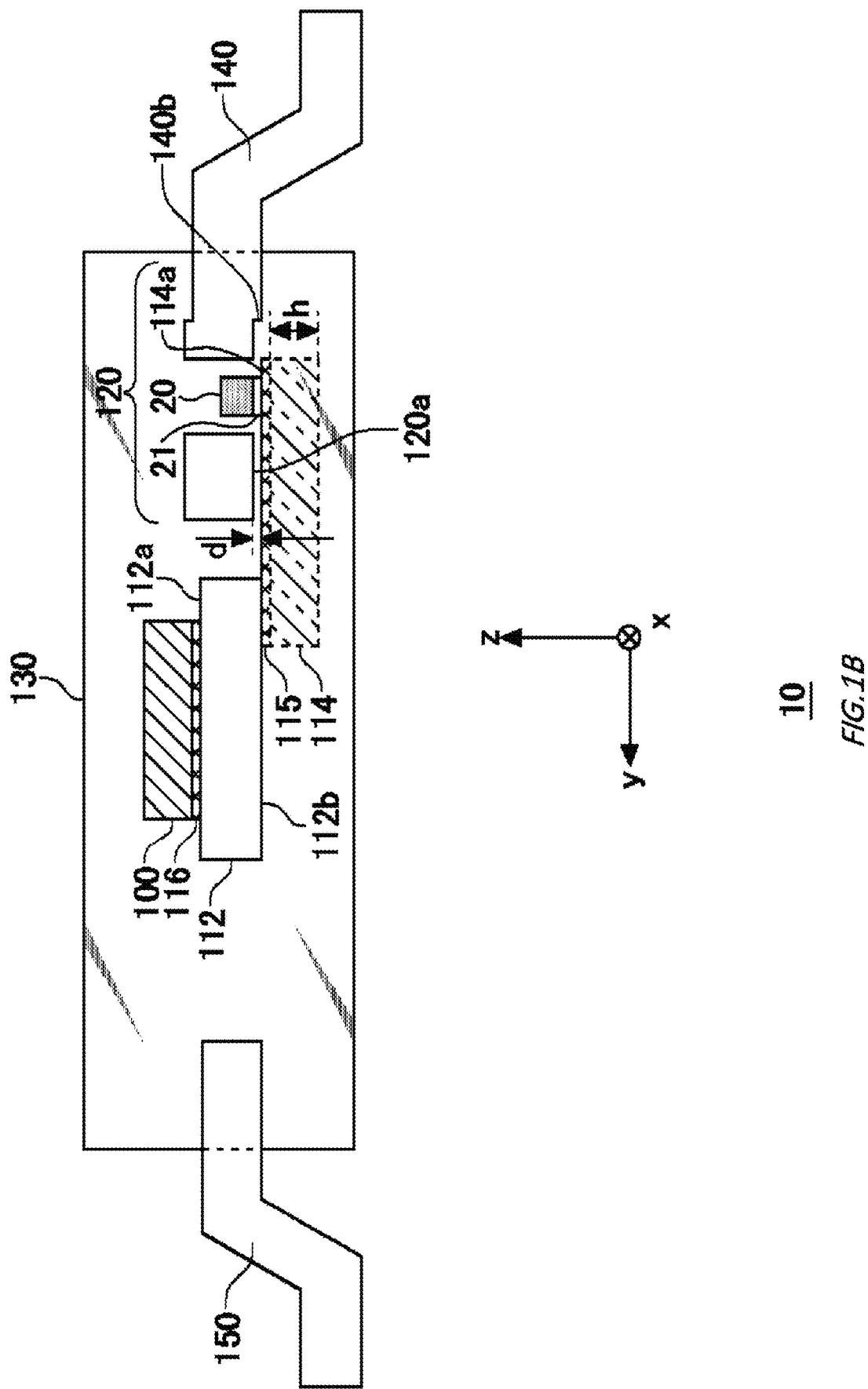
FIG. 1B is an A-A line sectional view of the current sensor shown in FIG. 1A.

FIG. 1A and FIG. 1B show the internal configuration of a semiconductor package that serves as a current sensor 10 according to a first embodiment. FIG. 1A is a schematic plan view seen from the top side (in the Z axis direction) of the current sensor 10 according to the first embodiment. FIG. 1B is an A-A line sectional view of the current sensor 10 shown in FIG. 1A.

For the coordinate, in FIG. 1A, the X axis direction is defined as a direction from bottom to top and parallel to the document, the Y axis direction is defined as a direction from right to left and parallel to the document, and the Z axis direction is defined as a direction from back to front and perpendicular to the document. Any one axis among the X axis, the Y axis, and the Z axis is orthogonal to another axis.

The current sensor 10 includes a signal processing IC 100, a magnetoelectric conversion element 20, an IC supporting portion 112, an element supporting portion 114, a conductor 120, an encapsulating portion 130, a pair of lead terminals 140, a plurality of lead terminals 150, and suspending pins 160. The magnetoelectric conversion element 20 is electrically connected to the signal processing IC 100 via wires 30. The signal processing IC 100 is electrically connected to the plurality of lead terminals 150 via wires 108. The wires 30 and the wires 108 may be formed of a conductor material, main components of which are Au, Ag, Cu, or Al.

The encapsulating portion 130 encapsulates the magnetoelectric conversion element 20, the conductor 120, the signal processing IC 100, the IC supporting portion 112, the element supporting portion 114, the wires 30, and the wires 108 by a mold resin. The mold resin may be, for example, comprised of an epoxy-based thermosetting resin added with silica and formed into a semiconductor package by a transfer molding. Because of forming into the semiconductor package, the current sensor 10 with a small size can be achieved.

The magnetoelectric conversion element 20 detects a magnetic field in a particular direction that changes in response to a measurement current flowing through the conductor 120, and then the signal processing IC 100 amplifies a signal that depends on an intensity of the magnetic field and outputs an amplified signal via the lead terminal 150. The magnetoelectric conversion element 20 may be a chip that is comprised of a compound semiconductor formed on a GaAs substrate and is cut into a square shape or a rectangular shape in the plan view in the Z axis direction. The magnetoelectric conversion element 20 may have a substrate comprised of silicon or compound semiconductor and a magnetoelectric conversion portion provided on the substrate. The thickness of the substrate is adjusted by grinding a surface on the negative side in the Z axis direction. The substrate may have a desired thickness in the range from 50 μm to 600 μm. Because the magnetic field in the Z axis direction is to be detected, a Hall element is appropriate as the depicted magnetoelectric conversion element. In addition, if the magnetoelectric conversion element 20 is arranged at a position for detecting a magnetic field in a direction of any one axis on the XY plane, for example, if it is arranged at a position for detecting a magnetic field in the X axis direction, a magneto-resistance element or a flux gate element is appropriate as the magnetoelectric conversion element.

In the first embodiment, an example is described where the current sensor 10 includes one magnetoelectric conversion element 20. However, the current sensor 10 may include two or more magnetoelectric conversion elements 20. In a plan view, at least a part of each of the plurality of magnetoelectric conversion elements 20 may be surrounded by the conductor 120. A part of the conductor 120 may be arranged between each of the plurality of magnetoelectric conversion elements 20.

The signal processing IC 100 processes a signal output from the magnetoelectric conversion element 20. The signal processing IC 100 is a large scale integration (LSI). The signal processing IC 100 is cut into a rectangular shape or a square shape in the plan view. The signal processing IC 100 is a signal processing circuit comprised of a Si monolithic semiconductor formed on a Si substrate. It may be a compound semiconductor substrate instead of the Si substrate. The signal processing circuit processes an output signal that depends on an intensity of a magnetic field output from the magnetoelectric conversion element 20. The signal processing circuit outputs, via the lead terminal 150, a signal indicating a current value of a measurement current flowing through the conductor 120 based on the output signal. The thickness of the substrate of the signal processing IC 100 is adjusted by grinding a surface on the negative side of the Z axis direction. The substrate has a desired thickness in the range from 50 μm to 600 μm. The signal processing circuit of the signal processing IC 100 includes a circuit that inputs a small output signal depending on the intensity of the magnetic field from the magnetoelectric conversion element and at least amplifies the input signal.

The conductor 120 has a U-shape in the plan view, surrounds at least partially the magnetoelectric conversion element 20 in the plan view, and flows a measurement current to be measured by the magnetoelectric conversion element 20. The conductor 120 is electrically connected to the pair of lead terminals 140. The conductor 120 may be configured to be physically integrated with the pair of lead terminals 140. The measurement current is input to one of the pair of lead terminals 140 and is output from the other of the lead terminals 140 via the conductor 120. The pair of lead terminals 140 and the conductor 120 may be configured to be integrated with each other through a lead frame of a conductor material, a main component of which is copper. The measurement current to be measured by the magnetoelectric conversion element 20 flows through the pair of lead terminals 140 and the conductor 120. The conductor 120 has a slit 140a that makes an opening on the side of a side surface 130a of the encapsulating portion 130. The magnetoelectric conversion element 20 is arranged within the slit 140a. The measurement current flowing through the conductor 120 flows from one end of the U-shape to the other end. This generates, around the conductor 120, a magnetic field that depends on an intensity of the measurement current and a distance from the conductor 120. At a position where the magnetoelectric conversion element 20 is arranged, the magnetic field is generated where the Z axis direction component is highest. Because the magnetoelectric conversion element 20 is arranged within the slit 140a, a high sensitivity can be achieved for the measurement current.

The pair of lead terminals 140 and the plurality of lead terminals 150 are arranged such that they oppose to each other via the signal processing IC 100 in the direction (the Y axis direction) that intersects with the thickness direction (the Z axis direction) of the signal processing IC 100. The pair of lead terminals 140 is partially exposed on the side surface 130a of the encapsulating portion 130. The plurality of lead terminals 150 is partially exposed on a side surface 130b that is opposite to the side surface 130a of the encapsulating portion 130. The suspending pins 160 are partially exposed on a side surface 130c and a side surface 130d that oppose to each other in the X axis direction and are different from the side surface 130a and the side surface 130b of the encapsulating portion 130. The suspending pins 160 are metal members to support a semiconductor package on a lead frame in the manufacturing phase. The suspending pins 160 are leads to support the encapsulating portion 130 that is formed by a mold resin during an assembly process.

The plurality of lead terminals 150 is a metal member electrically connected to the signal processing IC 100, and the suspending pins 160 are metal members not electrically connected to the signal processing IC 100. The suspending pins 160 are separate from the plurality of lead terminals 150. The plurality of lead terminals 150 and the suspending pins 160 may be comprised of a lead frame of a conductor material, a main component of which is copper, which are the same as the pair of lead terminals 140 and the conductor 120. The plurality of lead terminals 150 and the suspending pins 160 are separate from the conductor 120 and are electrically insulated from the conductor 120.

The pair of lead terminals 140, the conductor 120, the plurality of lead terminals 150, and the suspending pins 160 may be configured to be integrated with each other through a lead frame of a conductor material, a main component of which is copper. The pair of lead terminals 140 is a lead terminal on the primary side, and is an example of the pair of first lead terminals. The plurality of lead terminals 150 is a lead terminal on the secondary side, and is an example of the plurality of second lead terminals. The lead frame has a desired thickness in the range from 50 μm to 600 μm.

The IC supporting portion 112 is a plate-shaped member and supports the signal processing IC 100 on a surface 112a on the top side of the current sensor 10. The IC supporting portion 112 may be configured to be integrated with at least one lead terminal among the plurality of lead terminals 150. In the first embodiment, the IC supporting portion 112 is configured to be integrated with a lead terminal 150a and a lead terminal 150b positioned on both ends in the X axis direction among the plurality of lead terminals 150. The IC supporting portion 112 may be comprised of a lead frame including the plurality of lead terminals 150. The signal processing IC 100 may be adhered to the surface 112a of the IC supporting portion 112 via an adhesive layer 116. The adhesive layer 116 may be a die-attach film.

The IC supporting portion 112 has an extending portion 112c and an extending portion 112d that extend toward the pair of lead terminals 140 to surround the conductor 120. The conductor 120 and the magnetoelectric conversion element 20 are arranged between the extending portion 112c and the extending portion 112d. The extending portion 112c and the extending portion 112d are examples of a first portion and a second portion that are along the surface 112a and are spaced apart in the X axis direction.

The element supporting portion 114 is comprised of a metal plate or a semiconductor substrate and supports the magnetoelectric conversion element 20 and the IC supporting portion 112 on a surface 114a on the top side of the current sensor 10. The element supporting portion 114 is spaced apart from the conductor 120 and is electrically insulated from the conductor 120. The element supporting portion 114 supports, on the surface 114a, a surface 112b that is opposite to the surface 112a of the IC supporting portion 112 supporting the signal processing IC 100. The element supporting portion 114 overlaps the conductor 120 when seen in the thickness direction (the Z axis direction) of the magnetoelectric conversion element 20 but is physically spaced apart from the conductor 120. The semiconductor substrate constituting the element supporting portion 114 may be a silicon substrate, or a compound semiconductor substrate. The thickness of the semiconductor substrate may be in the range from 100 μm to 700 μm. The semiconductor substrate may have an appropriate thickness enough to prevent cracking, though it depends on a size of the semiconductor substrate. The metal plate constituting the element supporting portion 114 is preferably made of metal without a ferromagnetic property, such as copper or aluminum. The thickness of the metal plate may be appropriately selected in the range from 100 μm to 700 μm for ensuring a stiffness.

The element supporting portion 114 is adhered to the IC supporting portion 112 via an adhesive layer 115 and is adhered to the magnetoelectric conversion element 20 via the adhesive layer 115 and an adhesive layer 21. The adhesive layer 115 and the adhesive layer 21 may be a die-attach film.

The adhesive layer 21, the adhesive layer 115, and the adhesive layer 116 may have the same size as the magnetoelectric conversion element 20, the element supporting portion 114, and the signal processing IC 100 in the plan view. The adhesive layer 21, the adhesive layer 115, and the adhesive layer 116 may be a die-attach film comprised of a non-conductive resin or a die-attach film comprised of a conductive resin. The non-conductive resin may be an epoxy-based or silicone-based resin. The conductive resin may be an epoxy-based resin mixed with the filler of Ag. The adhesive layer 21, the adhesive layer 115, and the adhesive layer 116 have a desired thickness in the range from 1 μm to 50 μm. The adhesive layer 21, the adhesive layer 115, and the adhesive layer 116 may be a paste configured as conductive or non-conductive.

The element supporting portion 114 is adhered to a part of the surface 112b of the IC supporting portion 112 on the negative side of the Z axis direction and is arranged to project to a position of the magnetoelectric conversion element 20. The conductor 120 has a stepped portion 140b such that the surface 114a of the element supporting portion 114 and a surface 120a of the conductor 120 are spaced apart in the thickness direction (the Z axis direction) of the element supporting portion 114. The conductor 120 has the stepped portion 140b such that the portion of the conductor 120 facing the element supporting portion 114 protrudes toward the top side (the positive side of the Z axis direction) of the encapsulating portion 130. The stepped portion 140b may be provided on the conductor 120 by a half blanking process so that the element supporting portion 114 and the conductor 120 do not contact with each other. The stepped portion 140b may be provided on the conductor 120 by a coining process or a half etching process.

In a first embodiment, the element supporting portion 114 is adhered to the surface 112b of the IC supporting portion 112. However, the element supporting portion 114 may be adhered to only the extending portion 112c and the extending portion 112d of the IC supporting portion 112 and arranged to project to a position of the magnetoelectric conversion element 20.

The voltage of a primary circuitry to which the conductor 120 is connected via the lead terminals 140 is generally higher than the voltage of a secondary circuitry to which the signal processing IC 100 is connected via the lead terminal 150. Therefore, the conductor 120 must be electrically insulated from the magnetoelectric conversion element 20 and the signal processing IC 100 electrically connected through the wires 30. Therefore, the conductor 120 is covered with a mold resin, which is an insulator. The element supporting portion 114 on which the magnetoelectric conversion element 20 is placed has a gap of distance d with the conductor 120, which is provided by the stepped portion 140b provided on the conductor 120. The mold resin is mainly inserted into the gap between the element supporting portion 114 and the conductor 120. Because an electric field strength for dielectric breakdown of the general mold resin is about 20 kV/mm, the distance d of the gap designed to be 50 μm or more allows the mold resin inserted into the gap to achieve a withstand voltage of about 1 kV or more. When the voltage of the primary circuitry is AC 240 V and the voltage of the secondary circuitry is DC 5 V, a sufficient insulation can be ensured.

The element supporting portion 114 supports the extending portion 112c and the extending portion 112d on both end parts in the X axis direction. Herein, L(m) is the distance of the longitudinal length of the element supporting portion 114 not supporting the extending portion 112c and the extending portion 112d between both end parts in the X axis direction, b(m) is the width of the element supporting portion 114 in the Y axis direction, which is the transverse direction, and h(m) is the thickness of the element supporting portion 114. When a load P(N) is applied, in the negative direction of the Z axis direction, to a position at which the magnetoelectric conversion element 20 of the element supporting portion 114 is arranged, as in a three-point bending test, a stress σ(Pa) occurred at the element supporting portion 114 is represented as the following expression (1).

$$\sigma = (2/3) \times (PL/bh^2) \quad (1)$$

Herein, it is known from an experiment that, when the element supporting portion 114 is a silicon substrate, a breaking stress $\sigma_b$ of the silicon substrate is about 400 MPa. For example, if the stress σ which is occurred in the silicon substrate when die bonding a Hall element to the silicon substrate with 100 gf (which is approximately equal to $100 \times 10^{-4}$ N) is in the range lower than the breaking stress, an assembly can be performed without cracking the silicon substrate. Herein, assuming that the width b of the silicon substrate in the transverse direction is 0.3 mm, which is equivalent to the smallest width of the Hall element, the relational expression (2) is obtained between L and h.

$$\sigma = (2/3) \times ((100 \times 10^{-4}) \times L/(0.3 \times 10^{-3}) \times h^2) < (400 \times 10^6)$$
$$= \sigma_b$$

Hence, $L < 8 \times 10^6 \times h^2$ \quad (2)

As long as L and h meet the relational expression (2), a stable assembly can be performed with reducing the displacement of the Hall element.

In other words, when assuming that L is the distance of the longitudinal length of the element supporting portion 114 not supporting the extending portion 112c and the extending portion 112d between both end parts in the X axis direction and h is the thickness of the element supporting portion 114.

$$L < 8 \times 10^6 \times h^2$$

The above expression is preferably met.

Herein, it is also known from an experiment that, when the element supporting portion 114 is a GaAs substrate, a breaking stress ab of the GaAs substrate is about 100 MPa. Therefore, because the relational expression (A) is obtained between L and h by replacing the above-described (400× $10^6$) with ($100 \times 10^6$), it is more preferable that $L < 2 \times 10^6 \times h^2$ is met.

$$L < 2 \times 10^6 \times h^2 \quad (A)$$

On the other hand, the distance L of the longitudinal length of the element supporting portion 114 not supporting the extending portion 112c and the extending portion 112d between both end parts in the X axis direction must be greater than the minimum width of a blanked part of a lead frame. Therefore, because the minimum width of the blanked part of the lead frame is approximately the same as the thickness $t_{LF}$ of the lead frame, the relational expression (B) is obtained between L and $t_{LF}$.

$$t_{LF} < L \quad (B)$$

Because, for the current sensor according to the first embodiment, the element supporting member supporting the magnetoelectric conversion element 20 is comprised of a semiconductor substrate or a metal plate with a stiffness, a deformation of the element supporting portion 114 can be prevented so that a position of the magnetoelectric conversion element 20 is stabilized. This can reduce a variation among individuals in a sensitivity of a measurement current measured by the magnetoelectric conversion element 20 and can improve a quality of the current sensor 10.

Figure 2A:
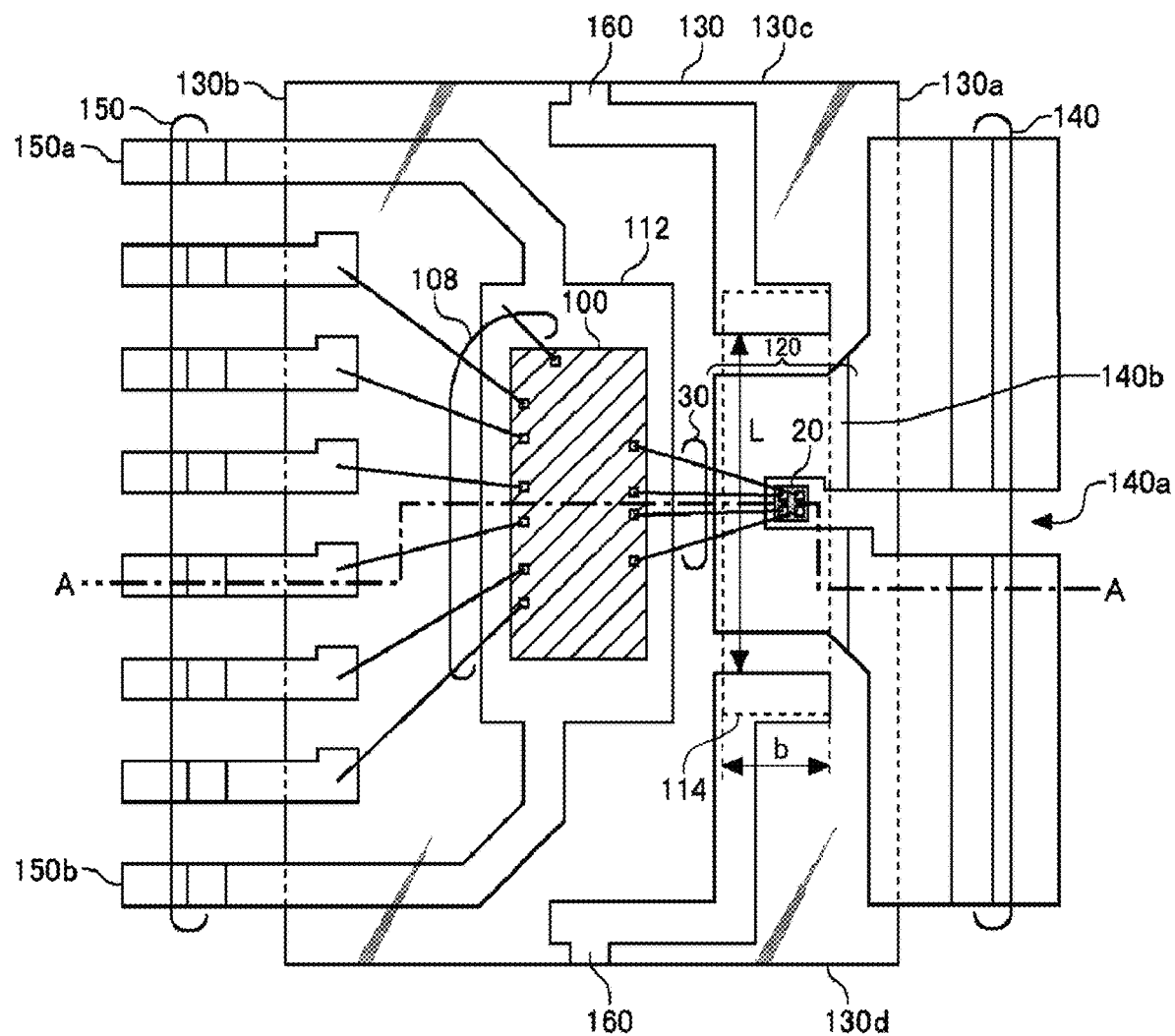
FIG. 2A is a schematic plan view seen from the top side of the current sensor according to a second embodiment.
Figure 2A:
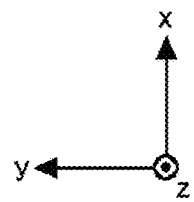
Figure 2B:
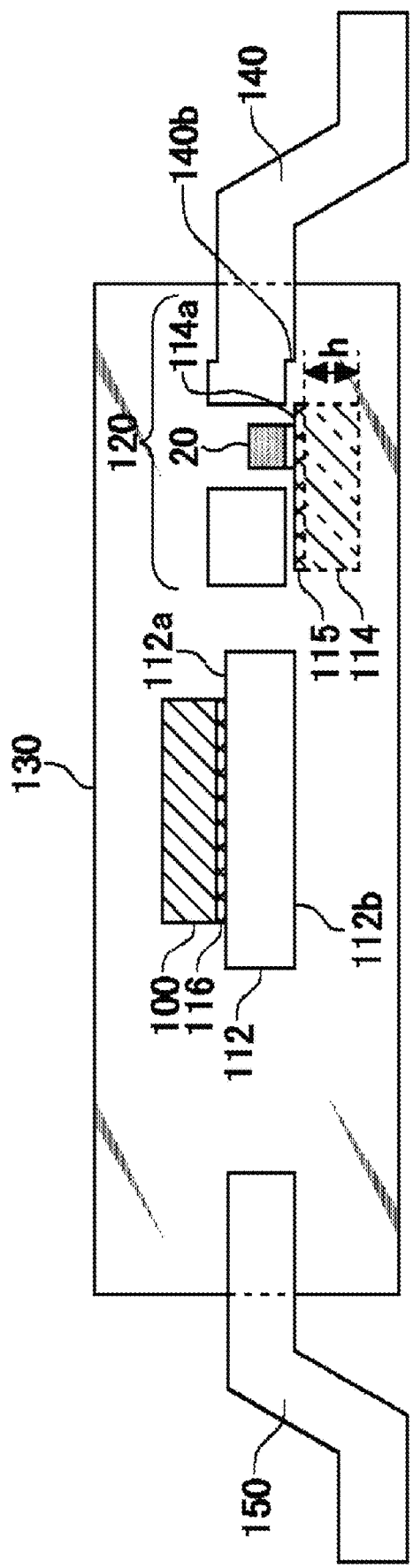
FIG. 2B is an A-A line sectional view of the current sensor shown in FIG. 2A.

FIG. 2A and FIG. 2B show the internal configuration of the semiconductor package that serves as the current sensor 10 according to a second embodiment. FIG. 2A is a schematic plan view seen from the top side (in the Z axis direction) of the current sensor 10 according to the second embodiment. FIG. 2B is an A-A line sectional view of the current sensor 10 shown in FIG. 2A.

The current sensor 10 according to the second embodiment is different from the current sensor 10 according to the first embodiment in that the metal members supporting the element supporting portion 114 are not members configured to be integrated with the lead terminals 150 but the suspending pins 160.

As with the current sensor 10 according to the first embodiment, in the current sensor 10 according to the second embodiment, the magnetoelectric conversion element 20 detects a magnetic field in a particular direction generated by a current flowing through the lead terminal 140. The signal processing IC 100 amplifies a signal depending on an intensity of the current, and an amplified signal is output from the lead terminals 150.

In the second embodiment, two suspending pins 160 extend from the side surface 130c and the side surface 130d of the encapsulating portion 130 to a position facing the conductor 120 toward the conductor 120. The suspending pins 160 are spaced apart from the conductor 120 and are electrically insulated from the conductor 120. The conductor 120 is arranged between the two suspending pins 160. The suspending pins 160 are metal members, which are not electrically connected to the signal processing IC 100. The suspending pins 160 are separate from the plurality of lead terminals 150.

Herein, L(m) is the distance of the longitudinal length of the element supporting portion 114 not supporting the two suspending pins 160 between both end parts in the X axis direction, b(m) is the width of the element supporting portion 114 in the Y axis direction, which is the transverse direction, and h(m) is the thickness of the element supporting portion 114. When a load P(N) is applied, in the negative direction of the Z axis direction, to a position at which the magnetoelectric conversion element 20 of the element supporting portion 114 is arranged, as in a three-point bending test, a stress σ(Pa) occurred at the element supporting portion 114 is represented as the following expression (1).

$$\sigma = (2/3) \times (PL/bh^2) \tag{1}$$

Herein, it is known from an experiment that, when the element supporting portion 114 is a silicon substrate, a breaking stress ab of the silicon substrate is about 400 MPa. For example, if the stress σ which is occurred in the silicon substrate when die bonding a Hall element to the silicon substrate with 100 gf (which is approximately equal to $100 \times 10^{-4}$ N) is in the range lower than the breaking stress, an assembly can be performed without cracking the silicon substrate. Herein, assuming that the width b of the silicon substrate in the transverse direction is 0.3 mm, which is equivalent to the smallest width of the Hall element, the relational expression (2) is obtained for L and h.

$$\sigma = (2/3) \times ((100 \times 10^{-4}) \times L/(0.3 \times 10^{-3}) \times h^2) < (400 \times 10^6)$$
$$= \sigma_b$$

Hence, $L < 8 \times 10^6 \times h^2$ \hfill (2)

As long as L and h meet the relational expression (2), a stable assembly can be performed with reducing the displacement of the Hall element.

In other words, $L < 8 \times 10^6 \times h^2$ is preferably met, wherein L is the distance of the longitudinal length of the element supporting portion 114 not supporting the two suspending pins 160 between both end parts in the X axis direction, and h is the thickness of the element supporting portion 114.

Herein, it is also known from an experiment that, when the element supporting portion 114 is a GaAs substrate, a breaking stress $\sigma_b$ of the GaAs substrate is about 100 MPa. Therefore, because the relational expression (A) is obtained between L and h by replacing the above-described ($400 \times 10^6$) with ($100 \times 10^6$), it is more preferable that $L < 2 \times 10^6 \times h^2$ is met.

$$L < 2 \times 10^6 \times h^2 \tag{A}$$

On the other hand, the distance L of the longitudinal length of the element supporting portion 114 not supporting the two suspending pins 160 between both end parts in the X axis direction must be greater than the minimum width of a blanked part of a lead frame. Therefore, because the minimum width of the blanked part of the lead frame is approximately the same as the thickness $t_{LF}$ of the lead frame, the relational expression (B) is obtained between L and $t_{LF}$.

$$t_{LF} < L \tag{B}$$

Because, for the current sensor 10 according to the second embodiment, the element supporting member supporting the magnetoelectric conversion element 20 is comprised of a semiconductor substrate or a metal plate with a stiffness, a deformation of the element supporting portion 114 can be prevented so that a position of the magnetoelectric conversion element 20 is stabilized. This can reduce a variation among individuals in a sensitivity of a measurement current measured by the magnetoelectric conversion element 20 and can improve a quality of the current sensor 10.

Figure 3A:
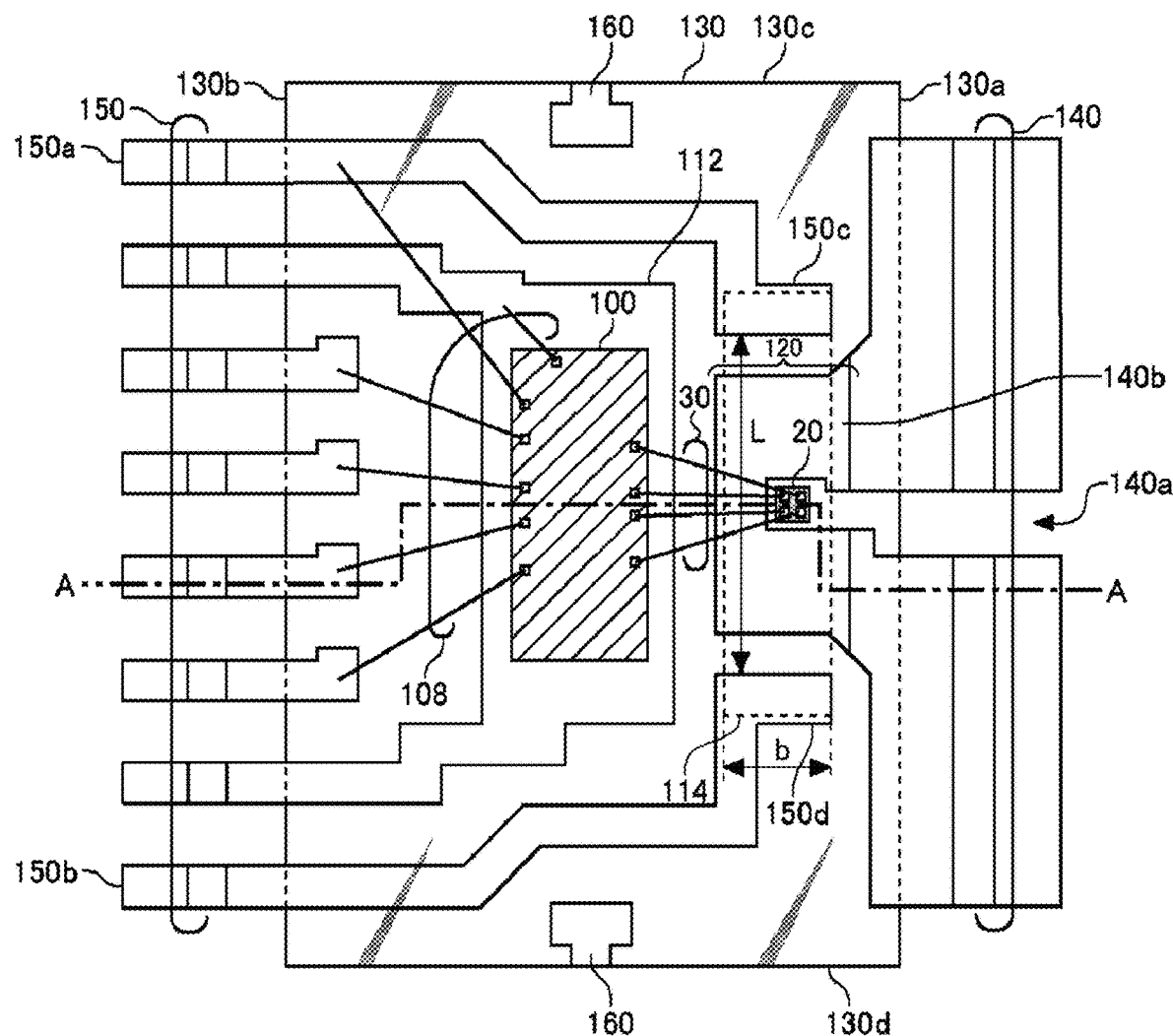
FIG. 3A is a schematic plan view seen from the top side of a current sensor according to a third embodiment.
Figure 3A:
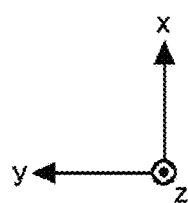

FIG. 3A and FIG. 3B show the internal configuration of the semiconductor package that serves as the current sensor 10 according to a third embodiment. FIG. 3A is the schematic plan view seen from the top side (in the Z axis direction) of the current sensor 10 according to the third embodiment. FIG. 3B is the A-A line sectional view of the current sensor 10 shown in FIG. 3A.

The current sensor 10 according to the third embodiment is different from the current sensor 10 according to the first embodiment, where the metal members supported by the element supporting portion 114 are the lead terminals 150 configured to be integrated with the IC supporting portion 112, in that the metal members supported by the element supporting portion 114 are the lead terminal 150a and the lead terminal 150b on both ends in the X axis direction other than the lead terminal 150 configured to be integrated with the IC supporting portion 112 among the plurality of lead terminals 150. Furthermore, the current sensor 10 according to the third embodiment is also different from the current sensor 10 according to the second embodiment, where the metal members supported by the element supporting portion 114 are not the lead terminals 150 but the suspending pins 160, in that the metal members supported by the element supporting portion 114 are the lead terminal 150a and the lead terminal 150b on both ends in the X axis direction other than the lead terminal 150 configured to be integrated with the IC supporting portion 112 among the plurality of lead terminals 150.

The lead terminal 150a and the lead terminal 150b are partially exposed on the side surface 130b of the encapsulating portion 130, like other lead terminals 150. The lead terminal 150a and the lead terminal 150b extend to positions facing the conductor 120 toward the pair of lead terminals 140. The conductor 120 and the magnetoelectric conversion element 20 are arranged between an end portion 150c and an end portion 150d embedded in the encapsulating portion 130 with the lead terminal 150a and the lead terminal 150b. The element supporting portion 114 supports the end portion 150c and the end portion 150d.

Herein, L(m) is the distance of the longitudinal length of the element supporting portion 114 not supporting the end portion 150c and the end portion 150d between both end parts in the X axis direction, b(m) is the width of the element supporting portion 114 in the Y axis direction, which is the transverse direction, and h(m) is the thickness of the element supporting portion 114. When a load P (N) is applied, in the negative direction of the Z axis direction, to a position at which the magnetoelectric conversion element 20 of the element supporting portion 114 is arranged, as in a three-point bending test, a stress σ(Pa) occurred at the element supporting portion 114 is represented as the following expression (1).

$$\sigma = (2/3) \times (PL/bh^2) \tag{1}$$

Herein, it is known from an experiment that, when the element supporting portion 114 is a silicon substrate, a breaking stress ab of the silicon substrate is about 400 MPa. For example, if the stress σ which is occurred in the silicon substrate when die bonding a Hall element to the silicon substrate with 100 gf (which is approximately equal to $100 \times 10^{-4}$ N) is in the range lower than the breaking stress, an assembly can be performed without cracking the silicon substrate. Herein, assuming that the width b of the silicon substrate in the transverse direction is 0.3 mm, which is equivalent to the smallest width of the Hall element, the relational expression (2) is obtained between L and h.

$$\sigma = (2/3) \times ((100 \times 10^{-4}) \times L/(0.3 \times 10^{-3}) \times h^2) < (400 \times 10^6) = \sigma_b$$

Hence, $L < 8 \times 10^6 \times h^2$ \hfill (2)

As long as L and h meet the relational expression (2), a stable assembly can be performed with reducing the displacement of the Hall element.

In other words, $L<8\times10^6\times h^2$ is preferably met, wherein L is the distance of the longitudinal length of the element supporting portion 114 not supporting the end portion 150c and the end portion 150d between both end parts in the X axis direction, and h is the thickness of the element supporting portion 114.

Herein, it is also known from an experiment that, when the element supporting portion 114 is a GaAs substrate, a breaking stress ab of the GaAs substrate is about 100 MPa. Therefore, because the relational expression (A) is obtained between L and h by replacing the above-described (400×$10^6$) with (100×$10^6$), it is more preferable that $L<2\times10^6\times h^2$ is met.

$$L<2\times10^6\times h^2 \tag{A}$$

On the other hand, the distance L of the longitudinal length of the element supporting portion 114 not supporting the end portion 150c and the end portion 150d between both end parts in the X axis direction must be greater than the minimum width of a blanked part of a lead frame. Therefore, because the minimum width of the blanked part of the lead frame is approximately the same as the thickness $t_{LF}$ of the lead frame, the relational expression (B) is obtained between L and $t_{LF}$.

$$t_{LF}<L \tag{B}$$

Because, for the current sensor 10 according to the third embodiment, the element supporting member supporting the magnetoelectric conversion element 20 is comprised of a semiconductor substrate or a metal plate with a stiffness, a deformation of the element supporting portion 114 can be prevented so that a position of the magnetoelectric conversion element 20 is stabilized. This can reduce a variation among individuals in a sensitivity of a measurement current measured by the magnetoelectric conversion element 20 and can improve a quality of the current sensor 10.

Figure 4A:
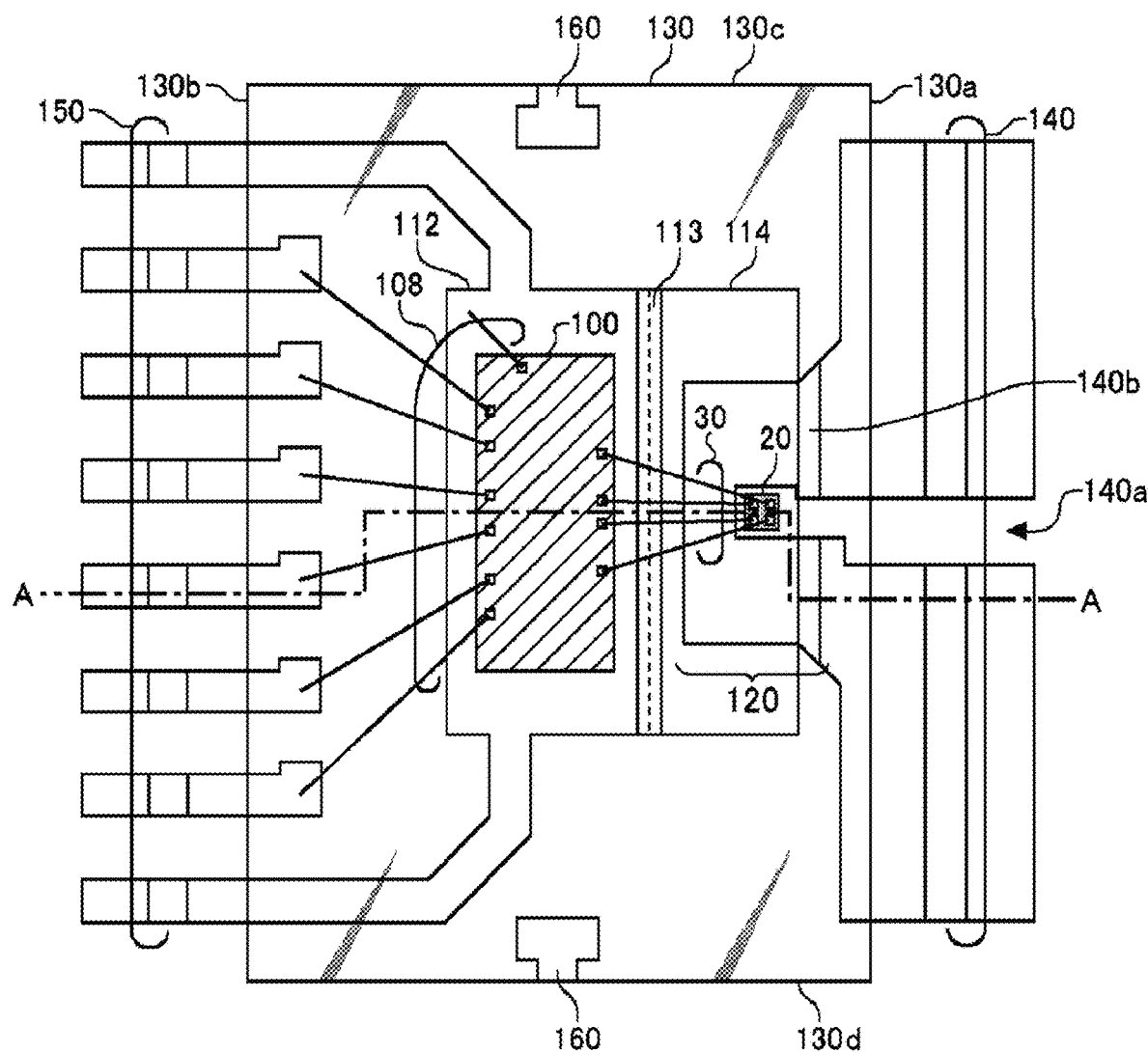
FIG. 4A is a schematic plan view seen from the top side of a current sensor according to a fourth embodiment.
Figure 4A:
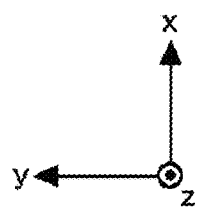
Figure 4B:
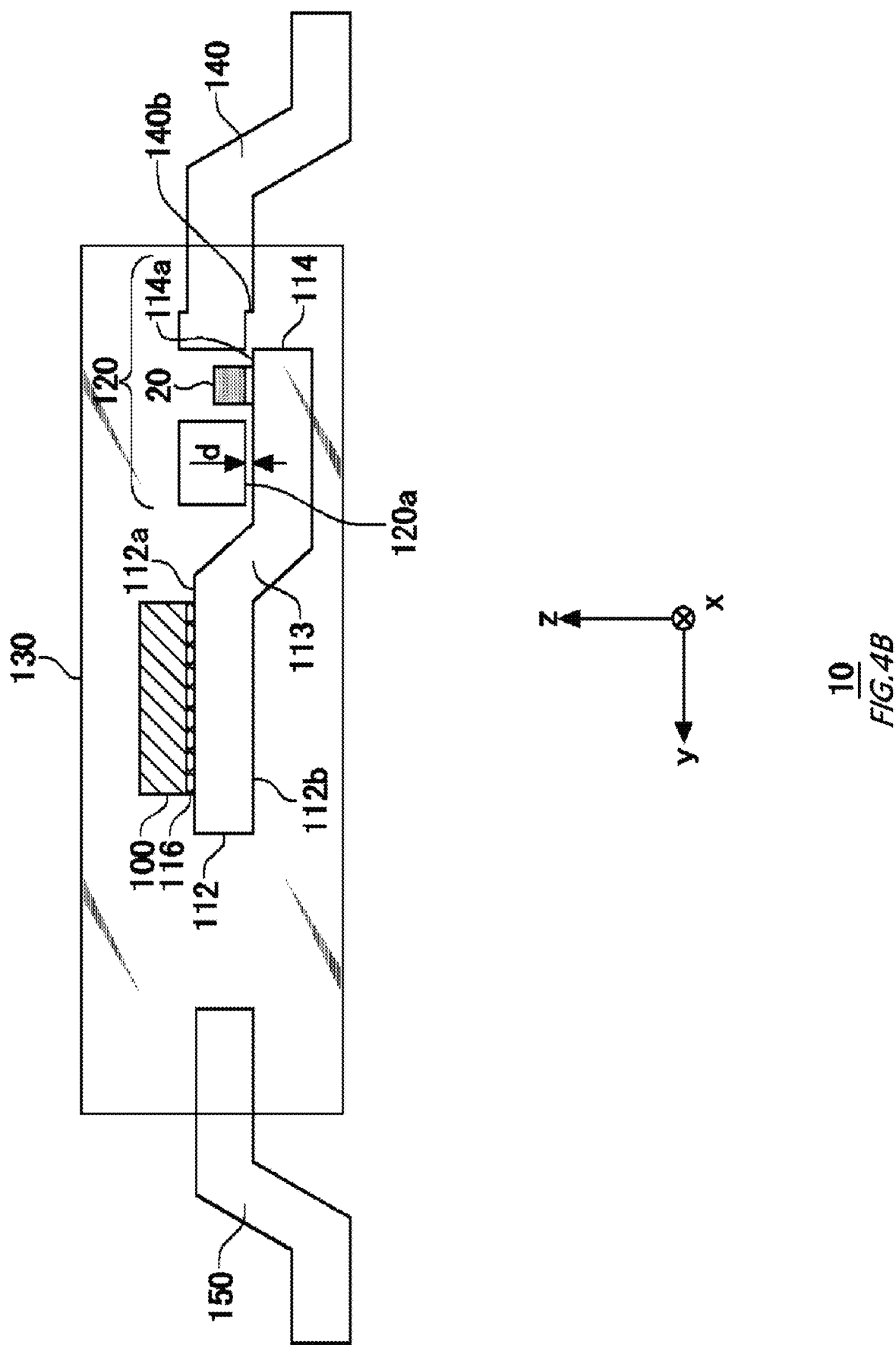
FIG. 4B is an A-A line sectional view of the current sensor shown in FIG. 4A.

FIG. 4A and FIG. 4B show the internal configuration of the semiconductor package that serves as the current sensor 10 according to a fourth embodiment. FIG. 4A is a schematic plan view seen from the top side (in the Z axis direction) of the current sensor 10 according to the fourth embodiment. FIG. 4B is the A-A line sectional view of the current sensor 10 shown in FIG. 4A.

The current sensor 10 according to the fourth embodiment is different from the current sensor 10 according to the first embodiment, the second embodiment, and the third embodiment in that the element supporting portion 114 comprised of the metal member spaced apart from the conductor 120 is configured to be integrated with the IC supporting portion 112 and the lead terminal 150a and the lead terminal 150b positioned at both ends among the plurality of lead terminals 150.

In the current sensor 10 according to the fourth embodiment, two lead frames are used and formed. One of the lead frames is comprised of the IC supporting portion 112, the element supporting portion 114, the lead terminals 150, and the suspending pins 160, and the other of the lead frames is comprised of the conductor 120 and the lead terminals 140. The two lead frames are preferably made of a conductor material, a main component of which is Cu, but it may be made of different conductive materials. In addition, in the fourth embodiment, the thickness of the two lead frames is the same but may be different.

In the fourth embodiment, the element supporting portion 114 is a lead provided by extending the IC supporting portion 112 and bending it at a bent portion 113 and is formed of a metal plate made of a conductive material. The element supporting portion 114 is arranged such that it overlaps the conductor 120 in a plan view and is arranged such that it does not contact with the conductor 120 in the thickness direction of the element supporting portion 114 with a gap of distance d in a cross sectional view. In other words, the IC supporting portion 112 and the element supporting portion 114 are linked together via the bent portion 113 that bends such that the surface 114a of the element supporting portion 114 and the surface 120a opposed to the element supporting portion 114 of the conductor 120 are spaced apart in the thickness direction (in the Z axis direction).

In addition, the element supporting portion 114 supports the magnetoelectric conversion element 20 arranged in the slit 140a that is a U-shape opening of the conductor 120. The bent portion 113 is provided on the lead of the linking portion between the IC supporting portion 112 closer to the conductor 120 and the element supporting portion 114. However, the bent portion 113 may be, for example, provided on the lead between the lead terminals 150 and the IC supporting portion 112. If the bent portion 113 is provided on a lead from the lead terminals 150 to the IC supporting portion 112, the element supporting portion 114 may be configured to be integrated with the IC supporting portion 112 without any steps when seen in the direction that intersects the thickness direction of the element supporting portion 114.

Because, for the current sensor 10 according to the fourth embodiment, the element supporting member supporting the magnetoelectric conversion element 20 is comprised of a metal plate with a stiffness, a deformation of the element supporting portion 114 can be prevented so that a position of the magnetoelectric conversion element 20 is stabilized. This can reduce a variation among individuals in a sensitivity of a measurement current measured by the magnetoelectric conversion element 20 and can improve a quality of the current sensor 10.

Figure 5:
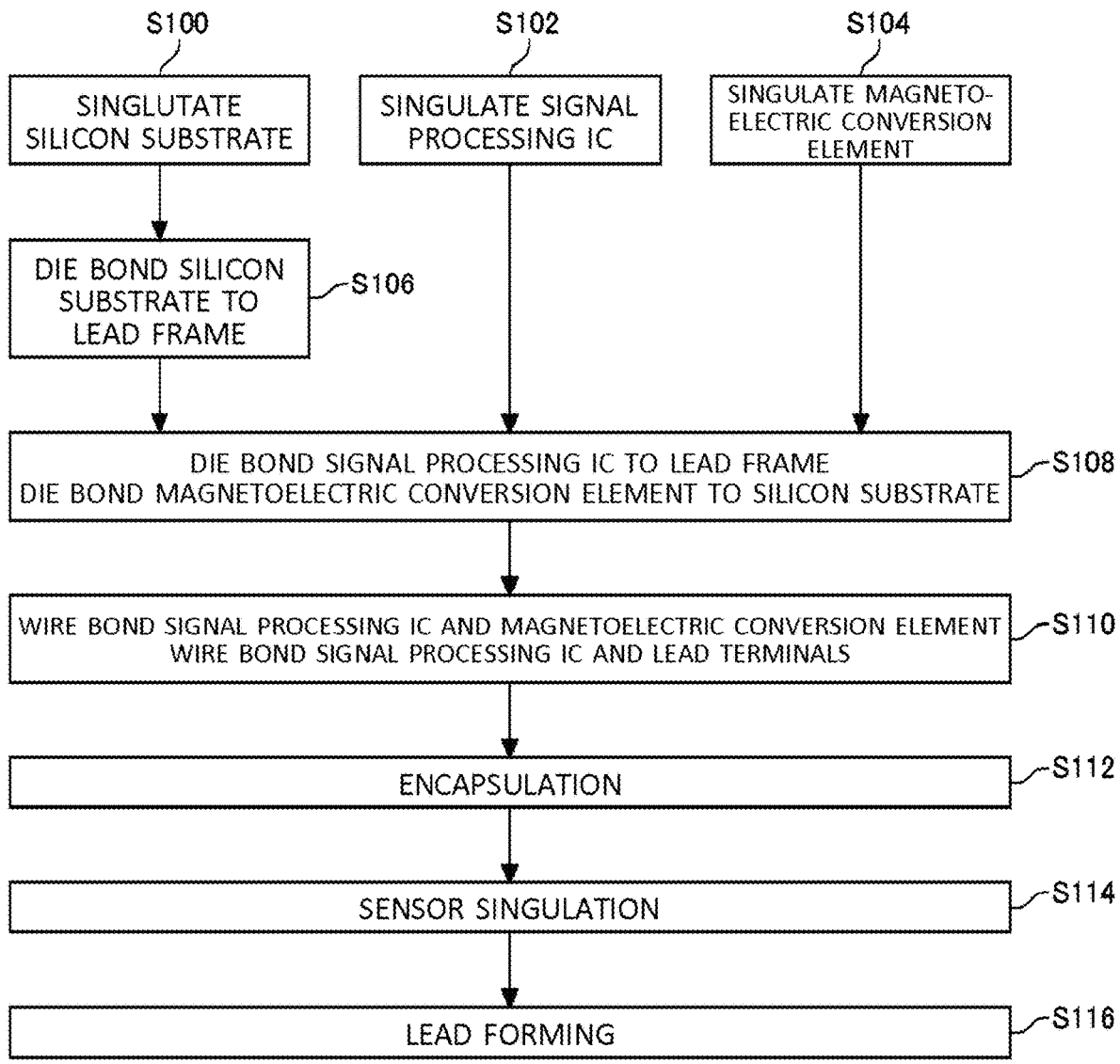
FIG. 5 is a flowchart showing a procedure of a manufacturing method of the current sensor according to the first embodiment.

FIG. 5 is a flowchart showing a procedure of a manufacturing method of the current sensor 10 according to the first embodiment. FIG. 6A, FIG. 6B, FIG. 6C, and FIG. 6D are schematic diagrams showing the manufacturing process of the current sensor 10 according to the first embodiment.

First, a semiconductor wafer is diced to singulate a silicon substrate to be used as the element supporting portion 114 (S100). The silicon substrate to be used as the element supporting portion 114 may be made by grinding a silicon wafer to a desired thickness with a back grind apparatus used in a back-end process, and then cutting it into a desired size with a dicing apparatus used in the back-end process. If a die-attach film is used for a dicing tape in a dicing, the element supporting portion 114 and the die-attach film as the adhesive layer 115 are simultaneously formed. Herein, the silicon substrate is used as an example, but a metal plate can also be made by being cut into a desire size with the dicing apparatus.

Furthermore, a wafer of the signal processing IC 100 is diced to singulate the signal processing IC 100 (S102). In addition, a wafer of the magnetoelectric conversion element 20 is diced to singulate the magnetoelectric conversion element 20 (S104). In a singulation process of the signal processing IC 100, the signal processing IC 100 is made by grinding the wafer of the signal processing IC 100 to a desired thickness with a back grind apparatus, and then cutting it into a desired size with a dicing apparatus. If a die-attach film is used for a dicing tape in a dicing, the signal processing IC 100 and the die-attach film as the adhesive layer 116 are simultaneously formed. In addition, in a singulation process of the magnetoelectric conversion element 20, the magnetoelectric conversion element 20 is made by grinding the wafer of the magnetoelectric conversion element 20 to a desired thickness with a back grind apparatus, and then cutting it into a desired size with a dicing apparatus. If a die-attach film is used for a dicing tape in a dicing, the magnetoelectric conversion element 20 and the die-attach film as the adhesive layer 21 are simultaneously formed.

Figure 6A:
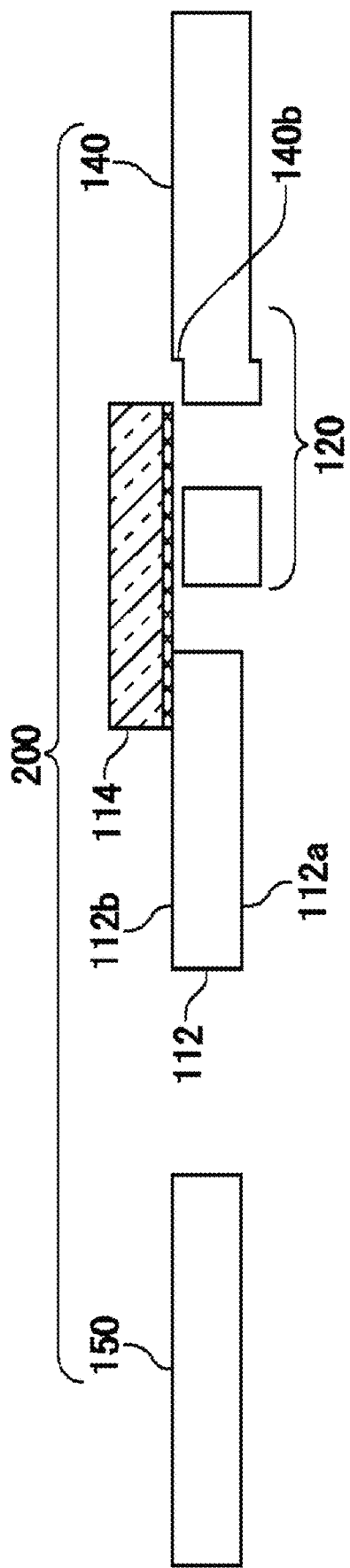
FIG. 6A is a schematic diagram showing the manufacturing process of the current sensor according to the first embodiment.

As shown in FIG. 6A, a lead frame 200 including the conductor 120, the IC supporting portion 112, the lead terminals 140, the lead terminals 150, and the suspending pins 160 is formed with the stepped portion 140b being provided at a portion of the conductor 120. Herein, in the lead frame 200, the surface 112a of the IC supporting portion 112 supporting the signal processing IC 100 is defined as a first surface and the surface 112b that is opposite to the first surface is defined as a second surface. The silicon substrate that is the element supporting portion 114 is adhered via the adhesive layer 115 through a die bonding on a part of the surface of the IC supporting portion 112 and the conductor 120 that is on the same side as the second surface of the lead frame 200 such that it does not contact the conductor 120 (S106). After the die bonding, it is desirable to cure the adhesive layer 115 to firmly bond it on the element supporting portion 114.

Figure 6B:
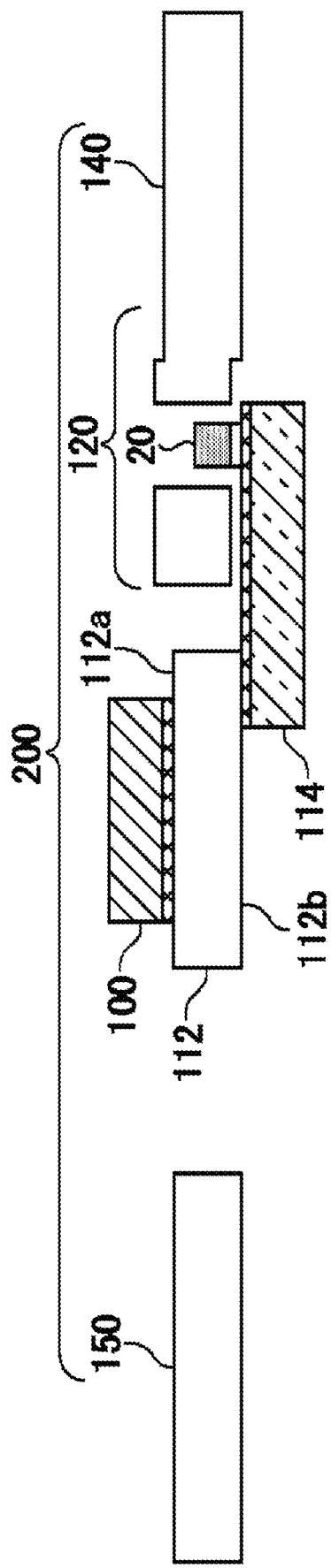
FIG. 6B is a schematic diagram showing the manufacturing process of the current sensor according to the first embodiment.

Then, as shown in FIG. 6B, the signal processing IC 100 is adhered via the adhesive layer 116 through a die bonding on the first surface of the IC supporting portion 112 of the lead frame 200, and the magnetoelectric conversion element 20 is adhered via the adhesive layer 21 through a die bonding on a part of the surface of the element supporting portion 114 that is on the same side as the first surface of the lead frame 200, such that the magnetoelectric conversion element 20 is at least partially surrounded by the conductor 120 in the plan view (S108). After the die bonding, it is desirable to cure the adhesive layer 116 of the signal processing IC 100 to firmly bond it to the IC supporting portion 112. In addition, after the die bonding, it is desirable to cure the adhesive layer 21 of the magnetoelectric conversion element 20 to firmly bond it to the element supporting portion 114.

Furthermore, the signal processing IC 100 and the magnetoelectric conversion element 20 are electrically connected together through a wire bonding, and furthermore the signal processing IC 100 and the lead terminals 150 on the secondary side are electrically connected through a wire bonding (S110).

Figure 6C:
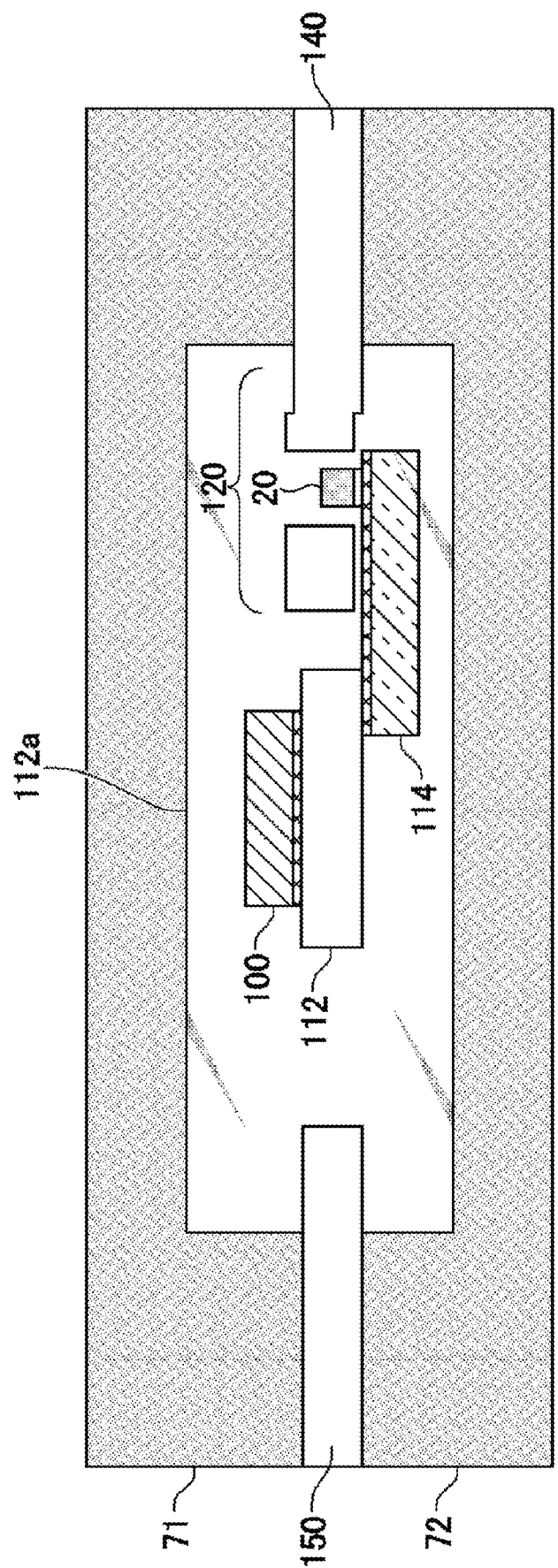
FIG. 6C is a schematic diagram showing the manufacturing process of the current sensor according to the first embodiment.

As shown in FIG. 6C, in an encapsulation process, the encapsulating portion 130 is formed by encapsulating the lead frame 200 including the IC supporting portion 112, the lead terminals 140, the lead terminals 150, and the suspending pins 160, the magnetoelectric conversion element 20, the element supporting portion 114, and the signal processing IC 100 with a mold resin (S112). In addition, in the encapsulation process, the lead frame 200 on which the element supporting portion 114, the magnetoelectric conversion element 20, and the signal processing IC 100 are assembled and electrically connected through the wires 30 and the wires 108 is inserted between a mold tool 71 and a mold tool 72 and is molded with a poured mold resin. After the encapsulation, it is desirable to cure the mold resin to be hardened sufficiently.

Figure 6D:
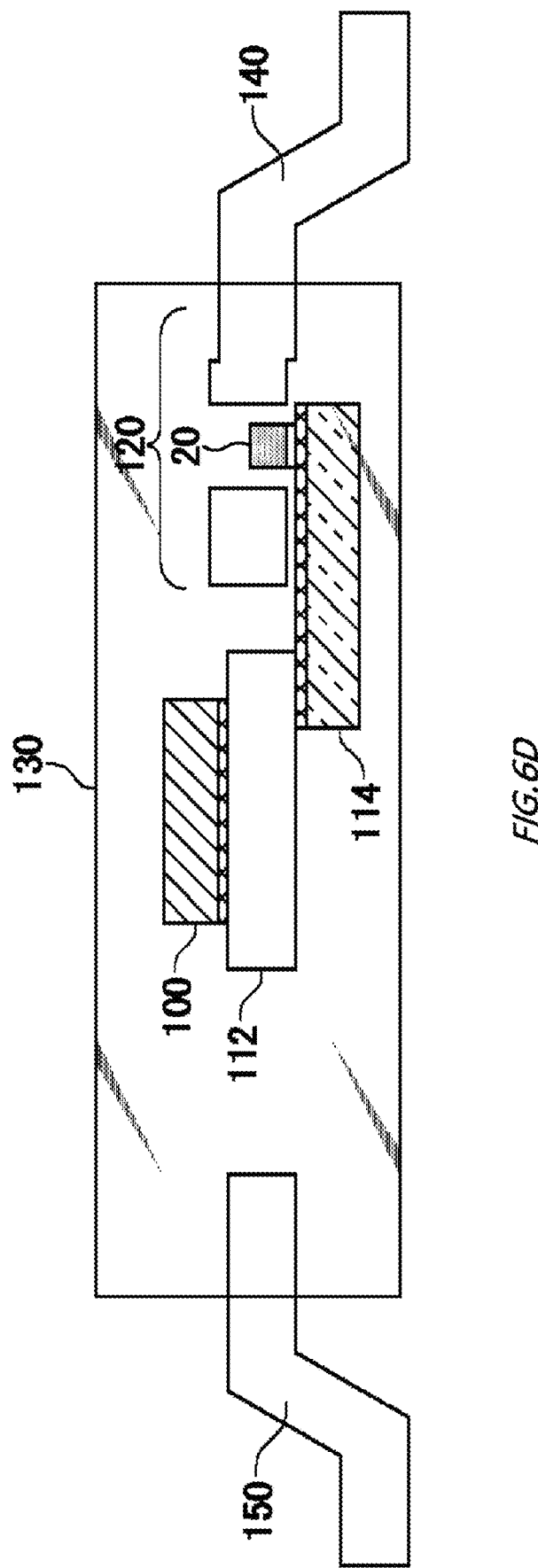
FIG. 6D is a schematic diagram showing the manufacturing process of the current sensor according to the first embodiment.

As shown in FIG. 6D, the current sensor that is encapsulated with a resin is singulated (S114), and a lead forming is performed to cut the lead terminals 140 and the lead terminals 150 into a desired length and form them into a desired shape (S116). Thus, the current sensor 10 according to the present embodiment is completed.

As described above, because, in the manufacturing method of the current sensor 10, everything can be handled with apparatuses of a back-end process, no investment on dedicated apparatuses is needed, resulting in an efficient production of the current sensor 10, reducing a cost through a volume efficiency.

Figure 7:
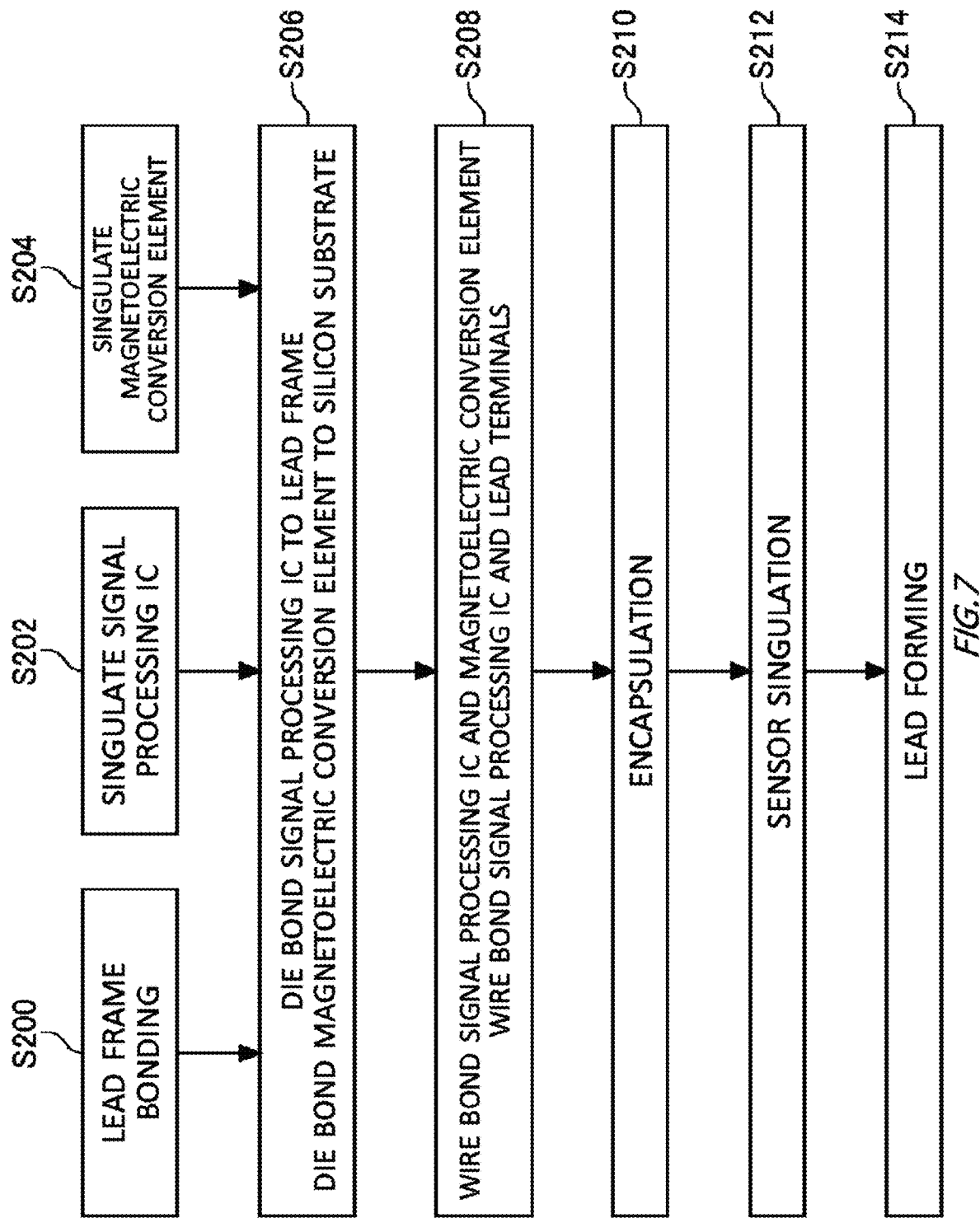
FIG. 7 is a flowchart showing a procedure of a manufacturing method of the current sensor according to the fourth embodiment.

FIG. 7 is a flowchart showing a procedure of a manufacturing method of the current sensor 10 according to the fourth embodiment. FIG. 8A, FIG. 8B, FIG. 8C, and FIG. 8D are schematic diagrams indicating the manufacturing process of the current sensor 10 according to the fourth embodiment.

The current sensor 10 according to the fourth embodiment is manufactured with a lead frame 200 and a lead frame 250. The lead frame 200 constitutes the plurality of lead terminals 150, the suspending pins 160, the IC supporting portion 112, and the element supporting portion 114. The lead frame 250 constitutes the conductor 120 and the lead terminals 140.

Figure 8A:
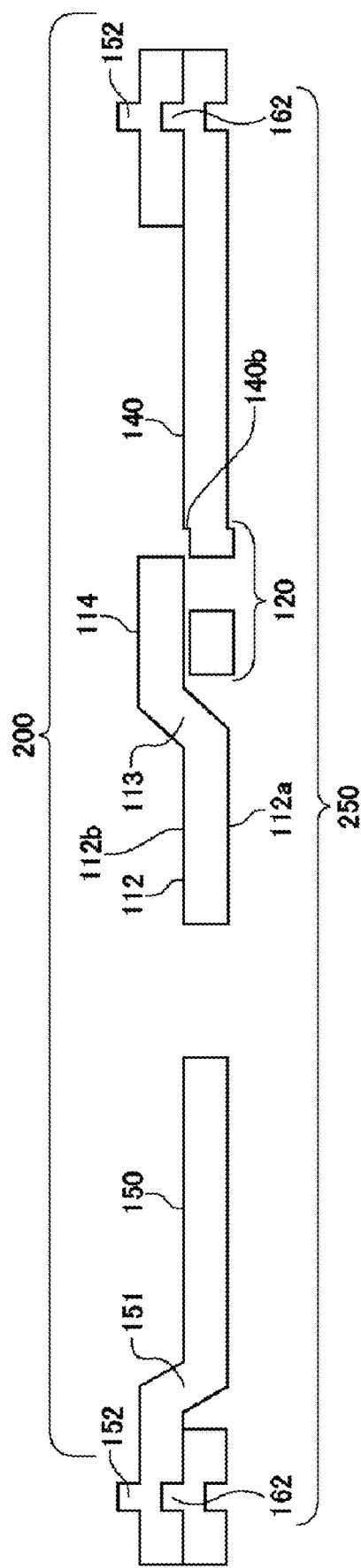
FIG. 8A is a schematic diagram showing the manufacturing process of the current sensor according to the fourth embodiment.

As shown in FIG. 8A, concave portions 152 are provided on a surface facing the lead frame 250 on each of both end parts of the lead frame 200. In addition, the convex portions 162 corresponding to the concave portions 152 are provided on a surface facing the lead frame 200 on both end parts of the lead frame 250. The concave portions 152 of the lead frame 200 and the convex portions 162 of the lead frame 250 are produced through a half blanking process, a coining process, or an etching process.

The lead frame 200 is formed such that it is bent at the bent portion 113, and the IC supporting portion 112 and the lead terminals 150 are provided on a surface at a first level, and the element supporting portion 114 and the lead on which the concave portion 152 is provided are provided on a surface at a second level that is different in the height in the thickness direction of the lead frame 200 from the first level. In addition, the lead frame 250 is formed such that the stepped portion 140b is provided on the portion corresponding to the conductor 120. The bent portion 113 is formed by being bent such that a step is formed between the surface at the first level and the surface at the second level to prevent the element supporting portion 114 and conductor 120 from being contacting each other by providing a gap of distance d between them when the two lead frames 200, 250 are bonded together. The bent portion 113 is produced through a bending process or a half blanking process. Herein, in the lead frame 200, the surface 112a of the IC supporting portion 112 supporting the signal processing IC 100 is defined as a first surface and a surface that is opposite to the first surface is defined as a second surface.

In the process of bonding of the lead frames (S200), the concave portions 152 on both end parts of the lead frame 200 and the convex portions 162 on both end parts of the lead frame 250 are fitted together, and the lead frame 200 and the lead frame 250 are fixed such that they overlap with a predetermined positional relationship. Thus, one lead frame including the element supporting portion 114 in addition to the IC supporting portion 112 can be made by bonding the lead frames together.

In parallel with bonding of the lead frames, a wafer of the signal processing IC 100 is diced to singulate the signal processing IC 100 (S202). In addition, a wafer of the magnetoelectric conversion element 20 is diced to singulate the magnetoelectric conversion element 20 (S204).

Figure 8B:
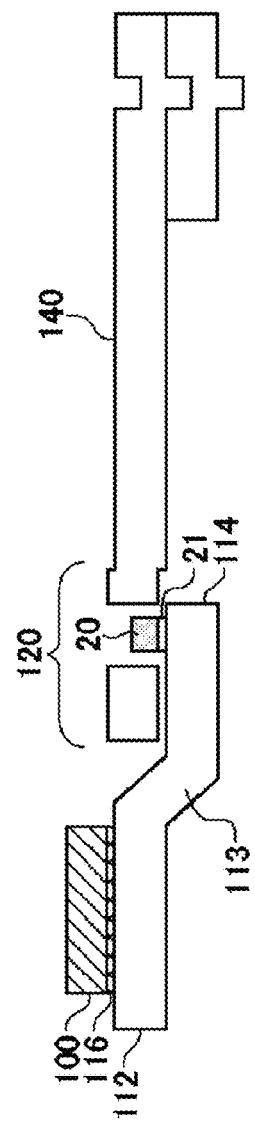
FIG. 8B is a schematic diagram showing the manufacturing process of the current sensor according to the fourth embodiment.

Then, as shown in FIG. 8B, the signal processing IC 100 is adhered via the adhesive layer 116 through die bonding on the first surface of the IC supporting portion 112 of the lead frame 200, and the magnetoelectric conversion element 20 is adhered via the adhesive layer 21 through die bonding on a part of the surface of the element supporting portion 114 that is on the same side as the first surface of the lead frame 200, such that the magnetoelectric conversion element 20 is at least partially surrounded by the conductor 120 in the plan view (S206).

In the process of die bonding of the signal processing IC 100 and the magnetoelectric conversion element 20 (S206), the signal processing IC 100 is placed on a portion of the IC supporting portion 112 on the side of the first surface of the lead frame 200 by using a die bonding apparatus, and the magnetoelectric conversion element 20 is placed on a portion of the element supporting portion 114 on the side of the first surface where the signal processing IC 100 of the lead frame 200 is die bonded. After the die bonding, it is desirable to cure the adhesive layer 116 of the signal processing IC 100 to firmly bond it to the IC supporting portion 112. In addition, after the die bonding, it is desirable to cure the adhesive layer 21 of the magnetoelectric conversion element 20 to firmly bond it to the element supporting portion 114.

Furthermore, the signal processing IC 100 and the magnetoelectric conversion element 20 are electrically connected together through a wire bonding, and furthermore the signal processing IC 100 and the lead terminals 150 on the secondary side are electrically connected through a wire bonding (S208).

Figure 8C:
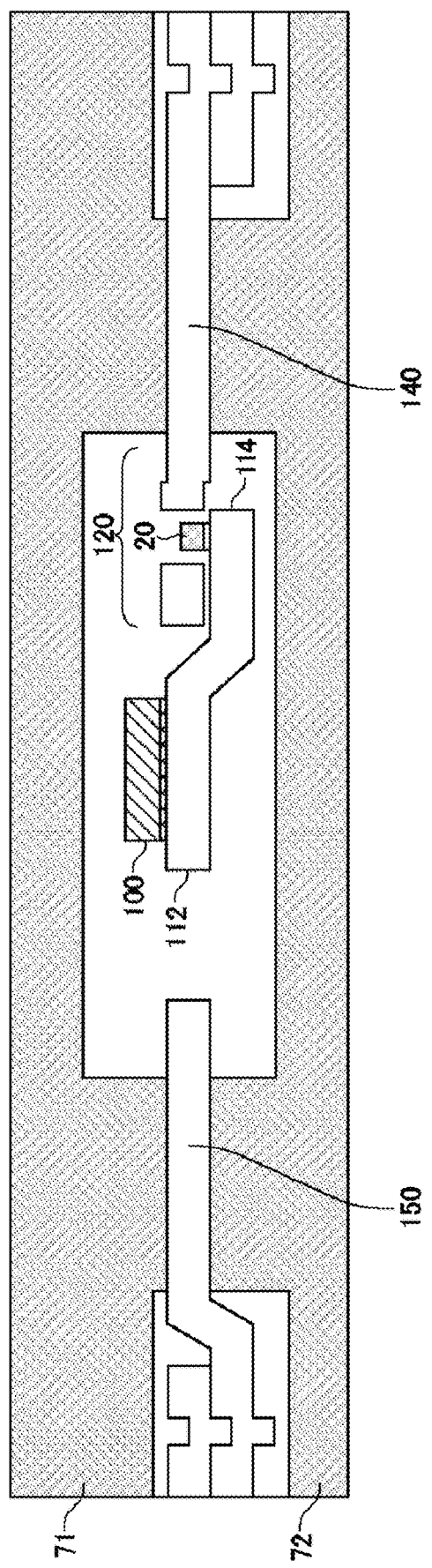
FIG. 8C is a schematic diagram showing the manufacturing process of the current sensor according to the fourth embodiment.

As shown in FIG. 8C, in an encapsulation process, the encapsulating portion 130 is formed by encapsulating the lead frame 200, 250 including the IC supporting portion 112, the element supporting portion 114, the lead terminals 140, the lead terminals 150, and the suspending pins 160, the magnetoelectric conversion element 20, and the signal processing IC 100 with a mold resin (S210).

In an encapsulation process, the lead frames 200, 250 on which the element supporting portion 114, the magnetoelectric conversion element 20, and the signal processing IC 100 are assembled and electrically connected through the wires 30 and the wires 108 are inserted between a mold tool 71 and a mold tool 72 and are molded by a poured mold resin. After the encapsulation, it is desirable to cure the mold resin to be hardened sufficiently.

Figure 8D:
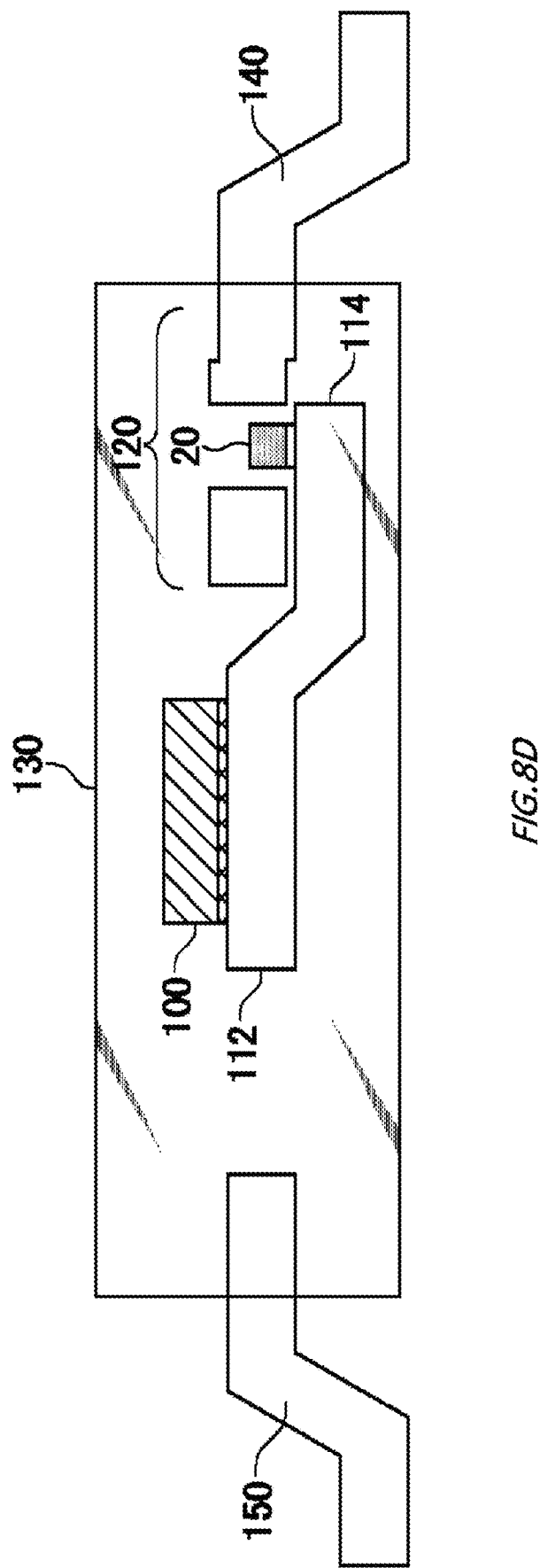
FIG. 8D is a schematic diagram showing the manufacturing process of the current sensor according to the fourth embodiment.

As shown in FIG. 8D, the current sensor that is encapsulated with a resin is singulated (S212), and a lead forming is performed to cut the lead terminals 140 and the lead terminals 150 into a desired length and form them into a desired shape (S214). Thus, the current sensor 10 according to the present embodiment is completed.

In the manufacturing method of the current sensor 10 according to the fourth embodiment, because everything except the bonding process of lead frames performed with a lead frame maker can be handled with apparatuses of a back-end process, no investment on dedicated apparatuses is needed, resulting in an efficient production, reducing a cost through a volume efficiency.

Figure 9:
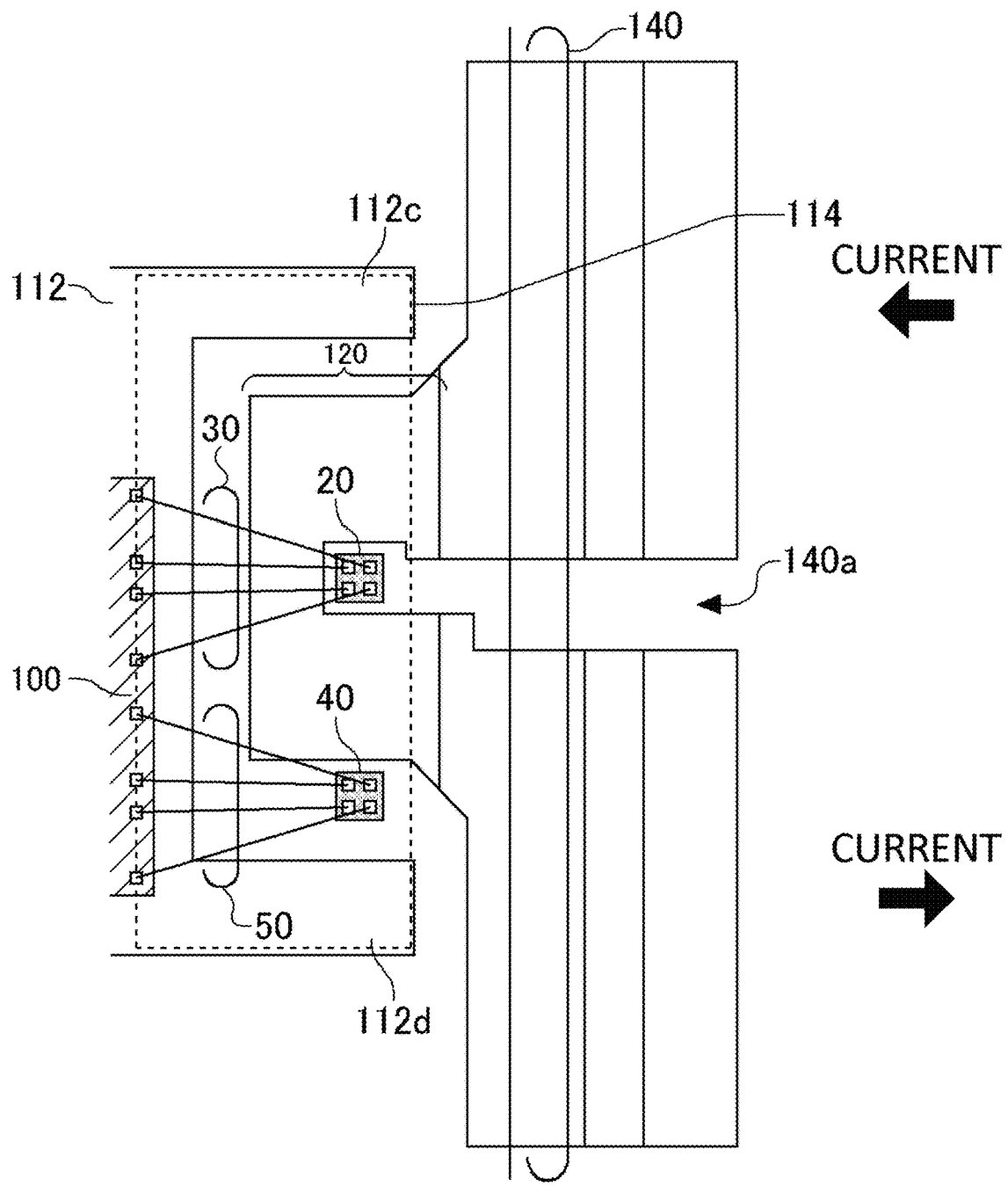
FIG. 9 is a schematic plan view seen from the top side around a conductor of the current sensor according to a variation of the first embodiment.

FIG. 9 is a variation of the first embodiment and shows the internal configuration of the semiconductor package that serves as the current sensor 10, in which only the surroundings of the conductor 120 is shown. FIG. 9 is a schematic plan view seen from the top side (in the Z axis direction) of the current sensor 10 according to a variation of the first embodiment.

As shown in FIG. 9, the current sensor 10 that is the variation of the first embodiment is formed such that two magnetoelectric conversion elements 20 and 40 are arranged near the conductor 120. The magnetoelectric conversion elements 20 and 40 are electrically connected to the signal processing IC 100 via the wires 30 and wires 50, respectively. The magnetoelectric conversion element 20 is in the slit 140a and is arranged on the surface 114a on the top side of the element supporting portion 114. In addition, the magnetoelectric conversion element 40 is positioned to be opposed to the magnetoelectric conversion element 20 in the X axis direction across the conductor 120 and is arranged on the surface 114a on the top side of the element supporting portion 114.

Thus, when a measurement current flowing through the conductor 120 is supplied in the direction of the depicted arrow, a magnetic field is generated in the positive direction of the Z axis direction at the position of the magnetoelectric conversion element 20, and a magnetic field is generated in the negative direction of the Z axis direction at the position of the magnetoelectric conversion element 40. For output voltages of the magnetoelectric conversion elements 20 and 40, the positive and negative voltage, or the negative and positive voltage is obtained. Therefore, a signal processing circuit calculates the difference in the output voltages between the magnetoelectric conversion elements 20 and 40 to obtain a signal depending on an intensity of current. On the other hand, because the same positive voltage or the same negative voltage is obtained for output voltages of the magnetoelectric conversion elements 20 and 40, an external magnetic field, for example, terrestrial magnetism is canceled out by calculating the difference. The current sensor 10 can achieve a higher sensitivity to a measurement current and a higher resistance to an external noise.

Herein, although described as a variation of the first embodiment, the example in which two magnetoelectric conversion elements 20 and 40 are arranged near the conductor 120 may be applied to the second embodiment, the third embodiment, and the fourth embodiment.

While the present invention has been described by way of the embodiments, the technical scope of the present invention is not limited to the above-described embodiments. It is apparent to persons skilled in the art that various alterations or improvements can be made to the above-described embodiments. It is also apparent from the description of the claims that the embodiments to which such alterations or improvements are made can be included in the technical scope of the present invention.

The operations, procedures, steps, stages, etc. of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

[Item 1] A current sensor comprising:
at least one magnetoelectric conversion element;
a conductor that at least partially surrounds the at least one magnetoelectric conversion element in a plan view and through which a measurement current to be measured by the at least one magnetoelectric conversion element flows;

a signal processing IC that processes a signal that is output from the at least one magnetoelectric conversion element;

an IC supporting portion that has a gap for electrical insulation from the conductor, has a first surface and a second surface that is opposite to the first surface, and supports the signal processing IC on the first surface;

an element supporting portion that is comprised of a metal plate or a semiconductor substrate, and supports the at least one magnetoelectric conversion element on a surface on a same side as the first surface, wherein the element supporting portion is arranged to be opposed to a surface on the same side as the second surface of the conductor, overlaps the conductor when seen in a thickness direction of the element supporting portion, does not overlap the conductor when seen in a direction intersecting the thickness direction.

[Item 2] The current sensor according to item 1, wherein the conductor includes a stepped portion such that the surface on a same side as the first surface of the element supporting portion is spaced apart in the thickness direction from the surface on a same side as the second surface of the conductor.

[Item 3] The current sensor according to item 1, further comprising:

an encapsulating portion that encapsulates the at least one magnetoelectric conversion element, the conductor, and the signal processing IC;

a pair of first lead terminals that is partially exposed on a side surface of the encapsulating portion, is electrically connected to the conductor, inputs the measurement current to the conductor, and outputs the measurement current from the conductor; and a metal member that is partially exposed on a side surface of the encapsulating portion and is spaced apart from the conductor, wherein the element supporting portion supports the at least one magnetoelectric conversion element and the metal member on the surface on the same side as the first surface.

[Item 4] The current sensor according to item 3, further comprising a plurality of second lead terminals that is partially exposed on a side surface of the encapsulating portion and is electrically connected to the signal processing IC, wherein the IC supporting portion is configured to be integrated with at least one second lead terminal among the plurality of second lead terminals.

[Item 5] The current sensor according to item 4, wherein the element supporting portion further supports, on the surface on the same side as the first surface of the IC supporting portion, the second surface that is opposite to the first surface that supports the signal processing IC.

[Item 6] The current sensor according to item 4, the metal member is separate from the plurality of second lead terminals and is not electrically connected to the signal processing IC.

[Item 7] The current sensor according to item 4, wherein the metal member is at least one second lead terminal different from the at least one second lead terminal among the plurality of second lead terminals.

[Item 8] The current sensor according to any one of items 5 to 7, wherein the pair of first lead terminals and the plurality of second lead terminals are arranged to be opposed via the signal processing IC in a first direction intersecting a thickness direction of the signal processing IC, the metal member includes a first portion and a second portion that are spaced apart in a second direction intersecting the first direction, the element supporting portion supports the first portion and the second portion on both end parts of the second direction, and $L<8\times10^6\times h^2$ is met, wherein L is defined as a distance in the second direction of a portion not supporting the first portion and the second portion between said both end parts of the element supporting portion, and h is defined as a thickness of the element supporting portion.

[Item 9] The current sensor according to any one of items 5 to 7, further comprising an adhesive layer that adheres the element supporting portion to the second surface of the IC supporting portion.

[Item 10] The current sensor according to item 9, wherein the adhesive layer is a die-attach film.

[Item 11] The current sensor according to item 3, further comprising a plurality of second lead terminals that is partially exposed on a side surface of the encapsulating portion and is electrically connected to the signal processing IC, wherein at least one lead terminal of the plurality of second lead terminals, the element supporting portion, and the IC supporting portion are configured to be integrated with each other.

[Item 12] The current sensor according to item 11, wherein the conductor includes a stepped portion such that the surface on the same side as the first surface of the element supporting portion is spaced apart in the thickness direction from the surface on the same side as the second surface of the conductor.

[Item 13] The current sensor according to item 11 or 12, wherein the IC supporting portion and the element supporting portion, or at least one of the plurality of second lead terminals and the IC supporting portion are linked via a bent portion that bends such that a surface on the same side as the first surface of the element supporting portion and the surface on the same side as the second surface of the conductor are spaced apart in the thickness direction.

[Item 14] The current sensor according to item 11, wherein the plurality of second lead terminals, the IC supporting portion, the element supporting portion, and the metal member are configured to be integrated with each other through a first lead frame, and the pair of first lead terminal and the conductor are configured to be integrated with each other through a second lead frame.

EXPLANATION OF REFERENCES

10: current sensor
20, 40: magnetoelectric conversion element
30, 50, 108: wire
71, 72: mold tool
100: signal processing IC
112: IC supporting portion
112c: extending portion
112d: extending portion
113: bent portion
114: element supporting portion
21, 115, 116: adhesive layer
120: conductor
130: encapsulating portion
140: lead terminal
140a: slit
140b: stepped portion 150, 150a, 150b: lead terminal
152: concave portion
162: convex portion
160: suspending pin
200, 250: lead frame.

What is claimed is:

1. A current sensor comprising:
   at least one magnetoelectric conversion element;
   a conductor that at least partially surrounds the at least one magnetoelectric conversion element in a plan view and through which a measurement current to be measured by the at least one magnetoelectric conversion element flows;
   a signal processing IC that processes a signal that is output from the at least one magnetoelectric conversion element;
   an IC supporting portion that has a gap for electrical insulation from the conductor, has a first surface and a second surface that is opposite to the first surface, and supports the signal processing IC on the first surface;
   an element supporting portion that is comprised of a metal plate or a semiconductor substrate, and supports the at least one magnetoelectric conversion element on a surface on a same side as the first surface;
   an encapsulating portion that encapsulates the at least one magnetoelectric conversion element, the conductor, and the signal processing IC;
   a pair of first lead terminals that is partially exposed on a side surface of the encapsulating portion, is electrically connected to the conductor, inputs the measurement current to the conductor, and outputs the measurement current from the conductor; and
   a plurality of second lead terminals that is partially exposed on a side surface of the encapsulating portion and is electrically connected to the signal processing IC, wherein
   the element supporting portion is arranged to be opposed to a surface of the conductor on a same side as the second surface, overlaps the conductor when seen in a thickness direction of the element supporting portion, and does not overlap the conductor when seen in a direction intersecting the thickness direction,
   at least one lead terminal among the plurality of second lead terminals, the element supporting portion, and the IC supporting portion are linked with each other in the plan view so as to be configured in an integrated manner, and
   the conductor includes a stepped portion such that the surface of the element supporting portion on the same side as the first surface is spaced apart in the thickness direction from the surface of the conductor on the same side as the second surface.

2. The current sensor according to claim 1, further comprising:
   a metal member that is partially exposed on a side surface of the encapsulating portion and is spaced apart from the conductor, wherein
   the metal member is separate from the plurality of second lead terminals and is not electrically connected to the signal processing IC.

3. The current sensor according to claim 2, wherein the plurality of second lead terminals, the IC supporting portion, the element supporting portion, and the metal member are configured to be integrated with each other through a first lead frame, and
   the pair of first lead terminals and the conductor are configured to be integrated with each other through a second lead frame.

4. The current sensor according to claim 1, wherein the IC supporting portion and the element supporting portion, or at least one of the plurality of second lead terminals and the IC supporting portion are linked via a bent portion that bends such that the surface of the element supporting portion on the same side as the first surface and the surface of the conductor on the same side as the second surface are spaced apart in the thickness direction.

* * * * *